(12) United States Patent
Liaw

(10) Patent No.: US 9,711,510 B2
(45) Date of Patent: Jul. 18, 2017

(54) MEMORY DEVICE AND MANUFACTURING METHOD THEREOF

(71) Applicant: TAIWAN SEMICONDUCTOR MANUFACTURING CO., LTD., Hsinchu (TW)

(72) Inventor: Jhon-Jhy Liaw, Zhudong Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 33 days.

(21) Appl. No.: 14/329,422

(22) Filed: Jul. 11, 2014

(65) Prior Publication Data
US 2015/0318289 A1  Nov. 5, 2015

Related U.S. Application Data

(60) Provisional application No. 61/986,623, filed on Apr. 30, 2014.

(51) Int. Cl.
| | | |
|---|---|---|
| H01L 27/11 | (2006.01) | |
| H01L 21/8238 | (2006.01) | |
| H01L 29/78 | (2006.01) | |
| H01L 29/423 | (2006.01) | |
| H01L 29/66 | (2006.01) | |
| H01L 27/02 | (2006.01) | |

(52) U.S. Cl.
CPC .. *H01L 27/1104* (2013.01); *H01L 21/823807* (2013.01); *H01L 21/823814* (2013.01); *H01L 21/823857* (2013.01); *H01L 21/823871* (2013.01); *H01L 21/823885* (2013.01); *H01L 27/1116* (2013.01); *H01L 29/42356* (2013.01); *H01L 29/7827* (2013.01); *H01L 27/0207* (2013.01); *H01L 29/66666* (2013.01)

(58) Field of Classification Search
CPC ............. H01L 27/1104; H01L 29/7827; H01L 29/42356; H01L 21/823885
See application file for complete search history.

(56) References Cited

U.S. PATENT DOCUMENTS

| | | | |
|---|---|---|---|
| 9,490,241 B2 | 11/2016 | Nomura et al. | |
| 2010/0224924 A1* | 9/2010 | Ellis | H01L 27/108 257/300 |
| 2011/0018056 A1 | 1/2011 | Takeuchi | |
| 2014/0151811 A1 | 6/2014 | Liaw | |

FOREIGN PATENT DOCUMENTS

KR  10-2013-0006340 A  1/2013

\* cited by examiner

*Primary Examiner* — Allison P Bernstein
(74) *Attorney, Agent, or Firm* — Maschoff Brennan

(57) ABSTRACT

A memory device includes a plurality of memory cells At least one of the memory cells includes a plurality of transistors with vertical-gate-all-around configurations and a plurality of active blocks. A portion of at least one of the active blocks serves as a source or a drain of one of the transistors.

20 Claims, 17 Drawing Sheets

MEMORY DEVICE AND MANUFACTURING METHOD THEREOF

RELATED APPLICATIONS

This application claims priority to U.S. Provisional Application Ser. No. 61/986,623, filed Apr. 30, 2014, which is herein incorporated by reference.

BACKGROUND

Static Random Access Memory (Static RAM or SRAM) is a semiconductor memory that retains data in a static form as long as the memory has power. SRAM is faster and more reliable than the more common dynamic RAM (DRAM). The term static is derived from the fact that it doesn't need to be refreshed like DRAM. SRAM is used for a computer's cache memory and as part of the random access memory digital-to-analog converter on a video card.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
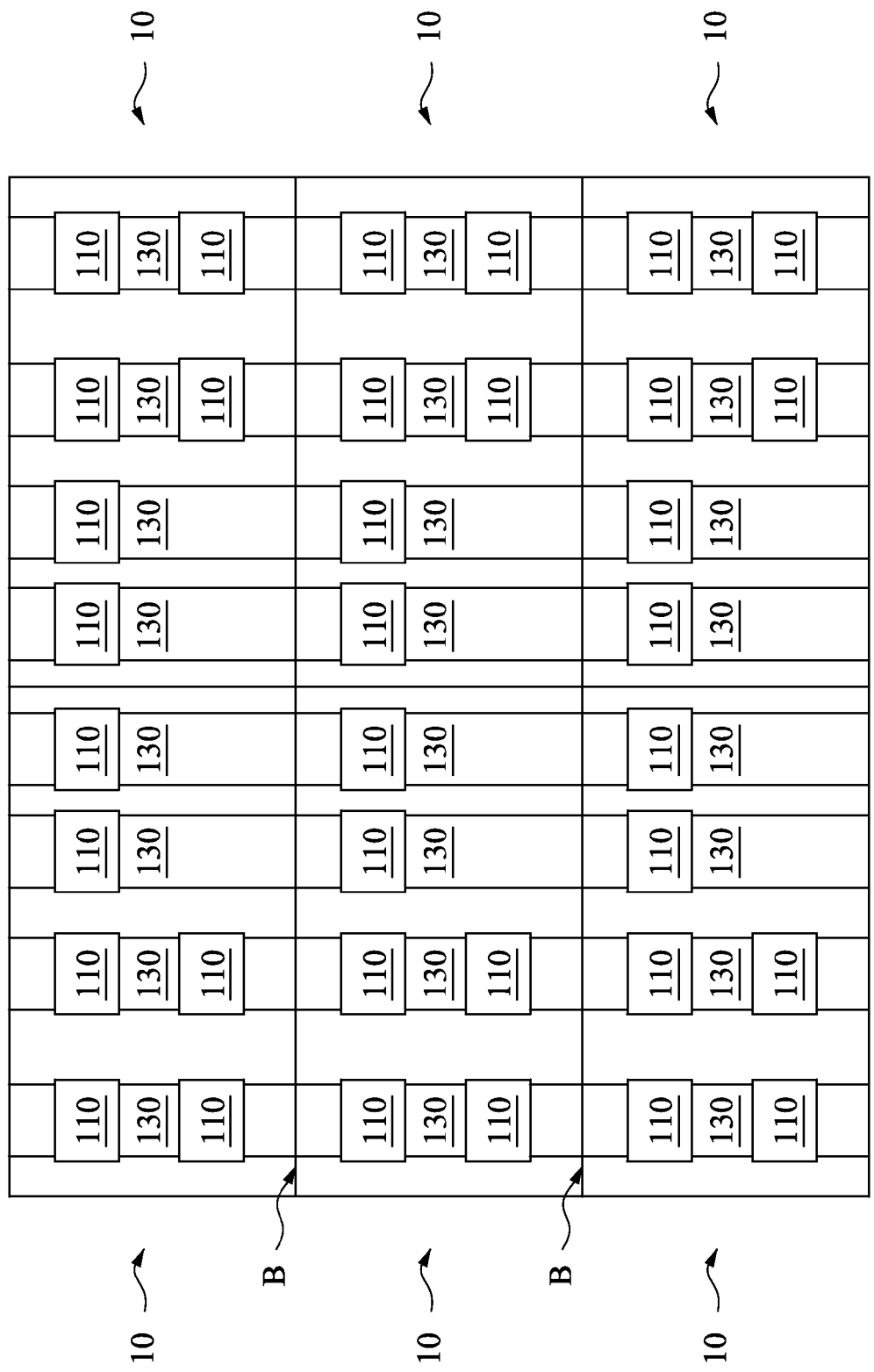
FIG. 1 is a plane view of a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a plane view of a memory device in accordance with various embodiments of the present disclosure. As shown in FIG. 1, the memory device includes a plurality of memory cells 10. At least one of the memory cells 10 includes a plurality of transistors 110 with vertical-gate-all-around (VGAA) configurations and a plurality of active blocks 130. A portion of at least one of the active blocks 130 serves as a source or a drain of one of the transistors 110.

In various embodiments of the present disclosure, the transistors 110 of the memory cells 10 are vertical-gate-all-around VGAA transistors, which provide high integration densities. The gate of the VGAA transistors 110 surrounds its channel region on sides, thereby improving its ability to control the flow of current and exhibiting good short channel control. The (VGAA) transistors 110 also provide advantages including gate controllability, low leakage, high on-off ratio, and enhanced carrier transport property. In addition, portions of the active blocks 130 respectively serve as the sources or drains of the transistors 110. Therefore, the active blocks 130 can serve as connection structures among the transistors 110 in one memory cell 10.

Figure 2A:
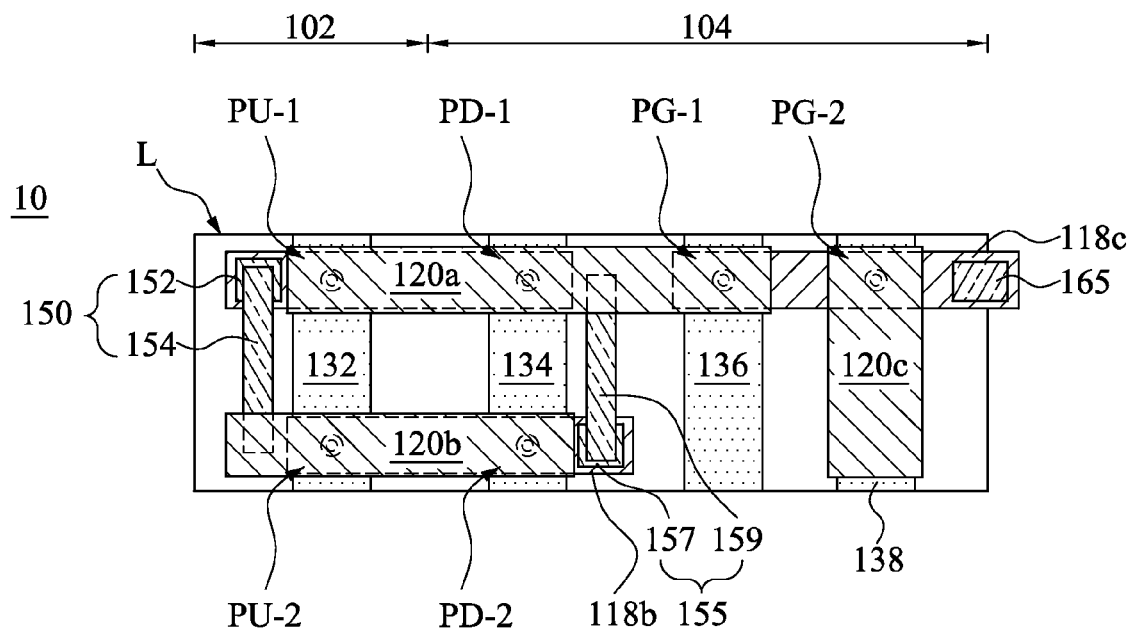
FIG. 2A is a plane view of one of memory cells of FIG. 1 in accordance with various embodiments.
Figure 2B:
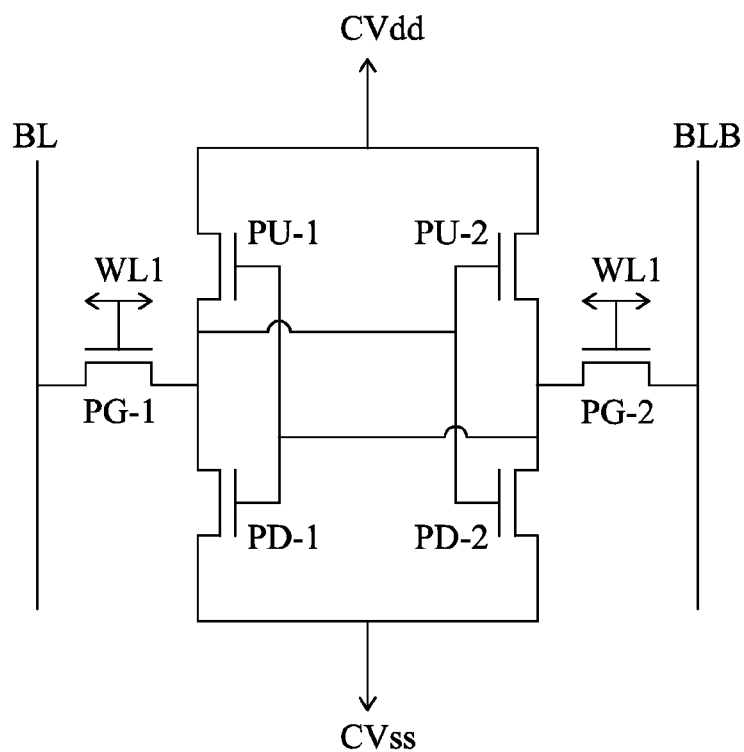
FIG. 2B is a circuit diagram of the memory cell of FIG. 2A.

In FIG. 1, the active blocks 130 extend across opposite boundaries B of the memory cell 10. In other words, the active blocks 130 of one of the memory cells 10 are respectively connected to the active blocks 130 of the adjacent memory cell 10. Since the active blocks 130 in one of the memory cell 10 extend across opposite boundaries B, the active blocks 130 in adjacent two of the memory cells 10 can be connected to each other. Therefore, external signals can be supplied to multiple memory cells 10 simultaneously through the active blocks 130 that are connected to each other FIG. 2A is a plane view of one of the memory cells 10 of FIG. 1 in accordance with various embodiments, and FIG. 2B is a circuit diagram of the memory cell 10 of FIG. 2A. For the sake of clarity, the first word line WL1, the first bit line BL, the second bit line BLB, and the power supply conductors CVdd, CVss are depicted in the circuit diagram and not in the plane view. In FIGS. 2A and 2B, the memory cell 10 is a six-transistor (6T) static random access memory (SRAM), and is an N-type pass gate device. That is, the memory cell 10 includes a first transistor PU-1 (also named a first pull-up transistor), a second transistor PU-2 (also named a second pull-up transistor), a third transistor PD-1 (also named a first pull-down transistor), a fourth transistor PD-2 (also named a second pull-down transistor), a fifth transistor PG-1 (also named a first pass-gate transistor), and a sixth transistor PG-2 (also named a second pass-gate transistor). Moreover, the memory cell 10 further includes a first active block 132, a second active block 134, a third active block 136, and a fourth active block 138. A portion of the first active block 132 is a source of the first transistor PU-1, another portion of the first active block 132 is a source of the second transistor PU-2, a portion of the second active block 134 is a source of the third transistor PD-1, another portion of the second active block 134 is a source of the fourth transistor PD-2, a portion of the third active block 136 is a source of the fifth transistor PG-1, and a portion of the fourth active block 138 is a source of the sixth transistor PG-2. That is, the first active block 132 further serves as a connection structure between the first transistor PU-1 and the second transistor PU-2, and the second active block 134 further serves as a connection structure between the third transistor PD-1 and the fourth transistor PD-2.

In FIG. 2A, the memory cell 10 further includes a first well 102 and a second well 104 disposed adjacent to the first well 102. The first well 102 and the second well 104 together occupy a layout area L of the memory cell 10. Dopants of the first well 102 are different from dopants of the second well 104. For the N-type pass gate device as shown in FIGS. 2A and 2B, the first well 102 is an N-type well, and the second well 104 is a P-type well. The first transistor PU-1 and the second transistor PU-2 are disposed on the first well 102, and the third transistor PD-1, the fourth transistor PD-2, the fifth transistor PG-1, and the sixth transistor PG-2 are disposed on the second well 104. Since there are two wells (i.e., the first well 102 and the second well 104) in the memory cell 10, the line width of the wells is wide, such that the wells can be formed using low cost lithoghaphy tool and masks.

In FIG. 2B, the sources of the first transistor PU-1 and the second transistor PU-2 are electrically connected to the power supply conductor CVdd. That is, the first active block 132 of FIG. 2A is electrically connected to the power supply conductor CVdd. The sources of the third transistor PD-1 and the fourth transistor PD-2 are electrically connected to the power supply conductor CVss. That is, the second active block 134 of FIG. 2A is electrically connected to the power supply conductor CVss. The source of the fifth transistor PG-1 is electrically connected to the first bit line BL. That is, the third active block 136 of FIG. 2A is electrically connected to the first bit-line BL. The source of the sixth transistor PG-2 is electrically connected to the second bit line BLB. That is, the fourth active block 138 of FIG. 2A is electrically connected to the second bit-line BLB.

In particular, the structure of the memory cell 10 in FIGS. 2A and 2B is described in the context of the 6T-SRAM. One of ordinary skill in the art, however, should understand that features of the various embodiments described herein may be used for forming other types of devices, such as an 8T-SRAM memory device, or memory devices other than SRAMs. Furthermore, embodiments of the present disclosure may be used as stand-alone memory devices, memory devices integrated with other integrated circuitry, or the like. Accordingly, the embodiments discussed herein are illustrative of specific ways to make and use the disclosure, and do not limit the scope of the disclosure.

Figure 3:
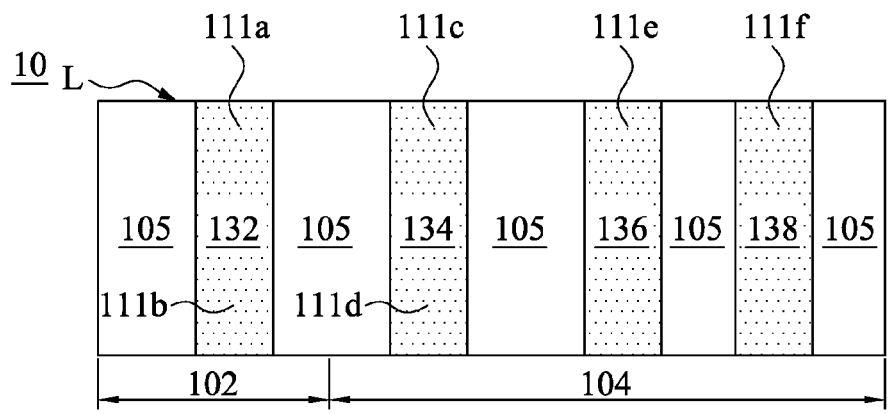
FIGS. 3~9 are plane views of a method for manufacturing the memory cell of FIG. 2A in accordance with various embodiments of the present disclosure.

The following paragraphs provide detailed explanations with respect to how to manufacture the memory cell 10 of FIG. 2A. FIGS. 3-9 are plane views of a method for manufacturing the memory cell 10 of FIG. 2A in accordance with various embodiments of the present disclosure, and FIG. 10 is a cross-sectional view taken along line 10-10 of FIG. 9. Reference is made to FIGS. 3 and 10. A first well 102 and a second well 104 are formed in a substrate 100. The first well 102 and the second well 104 together occupy a layout area L of the memory cell 10. The first well 102 is an N-type well, and the second well 104 is a P-type well. In various embodiments, the first well 102 and the second well 104 may be formed using masking and ion implantation technology. The substrate 100 may include monocrystalline silicon. In other embodiments, the substrate 100 may be made from silicon germanium, strained silicon, silicon on insulator, or composite silicon content. The substrate 100 may be a bulk-substrate or a non-bulk substrate.

Subsequently, a plurality of active blocks (i.e., the first active block 132, the second active block 134, the third active block 136, and the fourth active block 138) are formed on the first well 102 and the second well 104 and isolated from each other. In greater detail, the first active block 132 is formed on the first well 102, and the second active block 134, the third active block 136, and the fourth active block 138 are formed on the second well 104. Two portions of the first active block 132 respectively serve as bottom electrodes 111*a*, 111*b* (i.e. the sources) of the first transistor PU-1 and the second transistor PU-2 (see FIG. 8), two portions of the second active block 134 respectively serve as bottom electrodes 111*c* and 111*d* (i.e. the sources) of the third transistor PD-1 and the fourth transistor PD-2 (see FIG. 8), a portion of the third active block 136 serves as a bottom electrode 111*e* (i.e. the source) of the fifth transistor PG-1 (see FIG. 8), and a portion of the fourth active block 138 serves as a bottom electrode 111*f* (i.e. the source) of the sixth transistor PG-2 (see FIG. 8).

The first active block 132, the second active block 134, the third active block 136, and the fourth active block 138 may be formed using masking and ion implantation technology. Moreover, an isolation structure 105 can be formed in the substrate 100 and among the first active block 132, the second active block 134, the third active block 136, and the fourth active block 138 to isolate therebetween. The first active block 132 may be made from SiGe, Ge, SiP, SiC, III-V materials, or any combination thereof. The first active block 132 may be performed a p-doping process with dopants including B11, BF2, In, N, C, or any combination thereof. The second active block 134, the third active block 136, and the fourth active block 138 may be made from SiP, SiC, SiPC, Si, Ge, III-V materials, or any combination thereof. The second active block 134, the third active block 136, and the fourth active block 138 may be performed an n-doping process with dopants including P, As, Sb, N, C, or any combination thereof. The III-V materials include InP, InAs, GaAs, AlInAs, InGaP, InGaAs, GaAsSb, GaPN, AlPN, or any combination thereof.

In various embodiments, a silicide layer 140 can be formed on the first active block 132, the second active block 134, the third active block 136, and the fourth active block 138. The silicide layer 140 may be made from Ti, Co, Ni, Mo, Pt, or any combination thereof. For the sake of clarity, the silicide layer 140 is depicted in the cross-sectional view and is omitted in the plane view.

Figure 4:
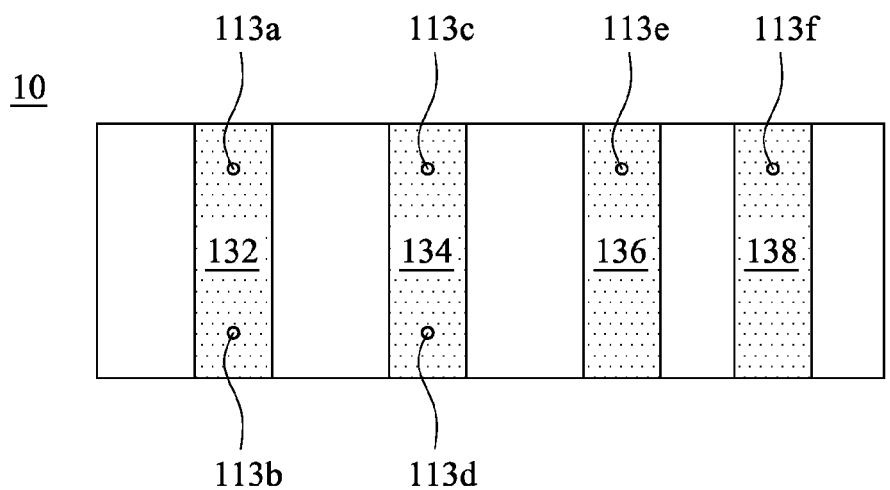

Reference is made to FIGS. 4 and 10. A plurality of channel rods 113a~113f are formed on the first active block 132, the second active block 134, the third active block 136, and the fourth active block 138. In greater detail, the channel rods 113a and 113b are formed on the first active block 132, the channel rods 113c and 113d are formed on the second active block 134, the channel rod 113e is formed on the third active block 136, and the channel rod 113f is formed on the fourth active block 138. The channel rods 113a, 113b, 113c, 113d, 113e, and 113f respectively serve as channels of the first transistor PU-1, the second transistor PU-2, the third transistor PD-1, the fourth transistor PD-2, the fifth transistor PG-1, and the sixth transistor PG-2 (see FIG. 8). The channel rods 113a~113f may be performed using epitaxy and polishing process. The channel rods 113a~113f may be made from silicon, Ge, SiGe, SiC, SiP, SiPC, SiGe with B11 doped, III-V material on the insulator, or any combination thereof. The III-V materials include InP, InAs, GaAs, AlInAs, InGaP, InGaAs, GaAsSb, GaPN, AlPN, or any combination thereof. The channel rods 113a and 113b may be performed a p-doping process with dopants including P, As, Sb, Ge, N, C, or any combination thereof, and the doping dose ranging from about 1e12~5e13. The channel rods 113c, 113d, 113e, and 113f may be performed an n-doping process with dopants including B11, BF2, In, Ge, N, C, or any combination thereof, and the doping dose ranging from about 1e12~5e13.

Figure 5:
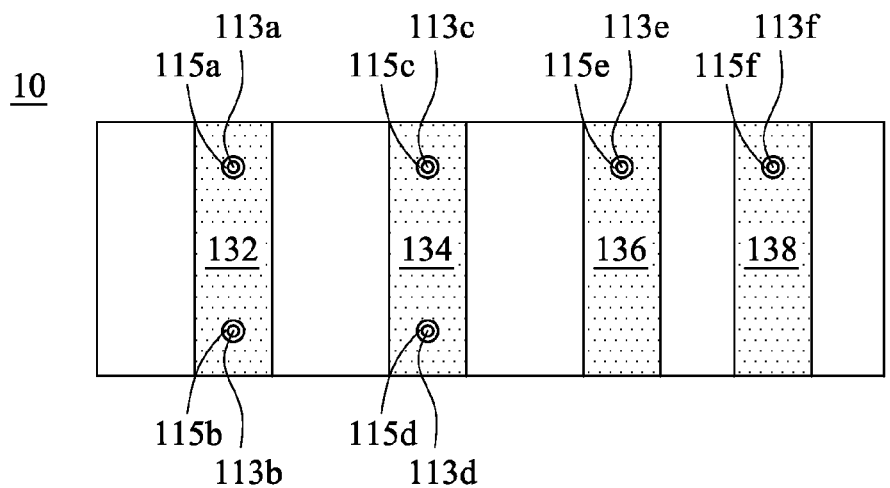

Reference is made to FIGS. 5 and 10. A plurality of gate insulators 115a~115f are formed to respectively surround the channel rods 113a~113f. The gate insulators 115a~115f may be performed using epitaxy process, and may be made from SiO$_2$, SiON, Si$_3$O$_4$, Ta$_2$O$_5$, Al$_2$O$_3$, PEOX, TEOS, nitrogen content oxide, nitrided oxide, Hf content oxide, Ta content oxide, Al content oxide, high-k materials (k>10), or any combination thereof.

Figure 6:
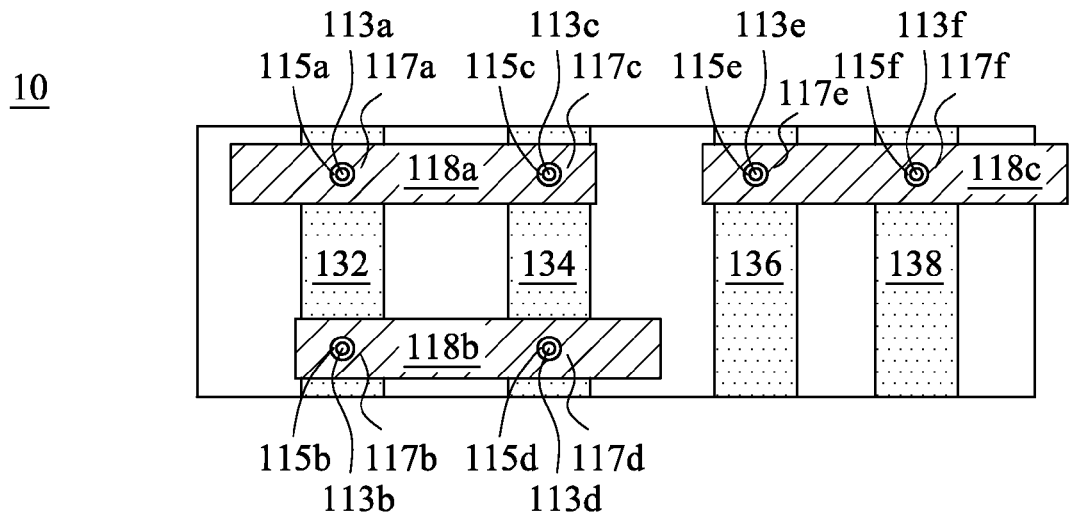
Figure 8:
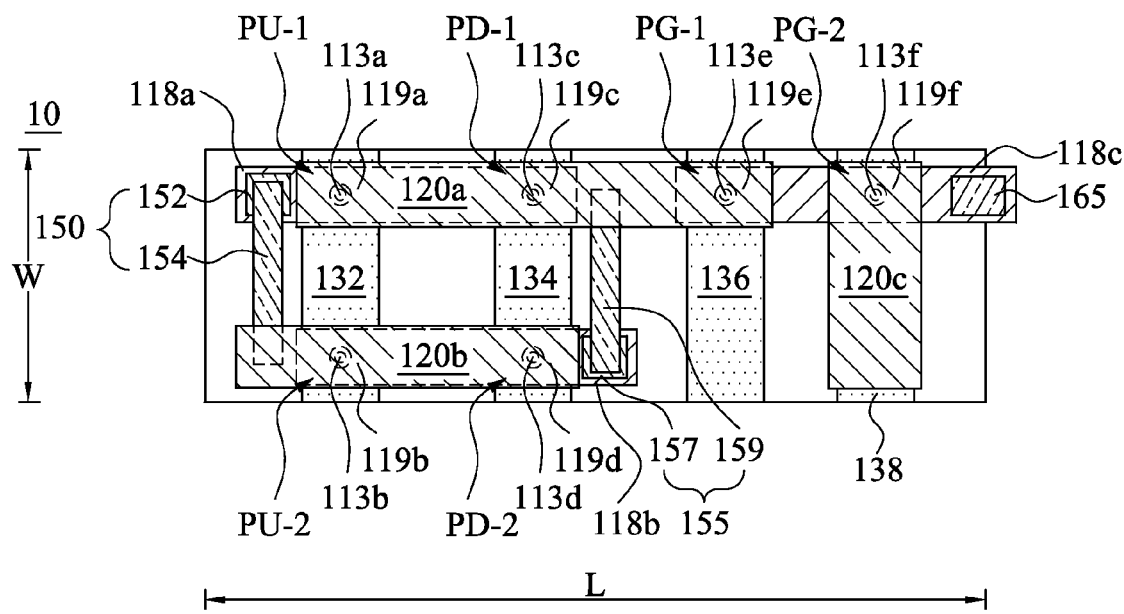

Reference is made to FIGS. 6 and 10. A plurality of gate plates (a first gate plate 118a, a second gate plate 118b, and a third gate plate 118c) are formed to surround the channel rod 113a~113f and the gate insulators 115a~115f. In greater detail, the first gate plate 118a surrounds the channel rod 113a, 113c and the gate insulators 115a, 115c. Two portions of the first gate plate 118a respectively serve as a gate 117a of the first transistor PU-1 (see FIG. 8) and a gate 117c of the third transistor PD-1 (see FIG. 8). The gate plate 118a overlaps the first active block 132 and the second active block 134. The second gate plate 118b surrounds the channel rods 113b, 113d and the gate insulators 115b, 115d. Two portions of the second gate plate 118b respectively serve as a gate 117b of the second transistor PU-2 (see. FIG. 8) and a gate 117d of the fourth transistor PD-2 (see FIG. 8). The second gate plate 118b overlaps the first active block 132 and the second active block 134. The third gate plate 118c surrounds the channel rods 113e, 113f and the gate insulators 115e, 115f. Two portions of the third gate plate 118c respectively serve as a gate 117e of the fifth transistor PG-1 (see FIG. 8) and a gate 117f of the sixth transistor PG-2 (see FIG. 8). The third gate plate 118c overlaps the third active block 136 and the fourth active block 138. The first gate plate 118a, the second gate plate 118b, and the third gate plate 118c may be performed using deposition and etching process, and may be made from poly-Si with silicide, Al, Cu, W, Ti, Ta, N, refractory material (TiN, TaN, TiW, TiAl), or any combination thereof.

Figure 7:
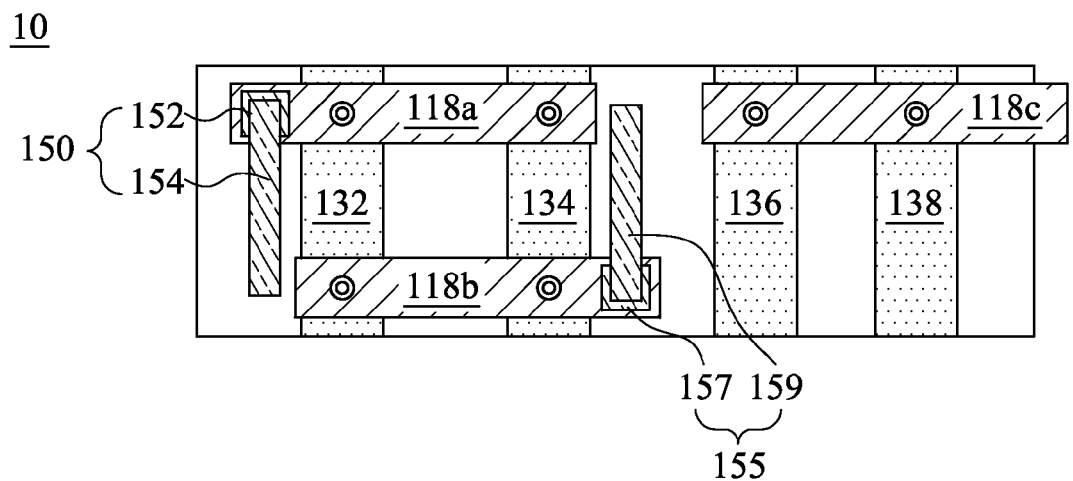

Reference is made to FIGS. 7 and 10. A first contact 150 is formed to connect to the first gate plate 118a. The first contact 150 can be formed above an area at the side of the first active block 132 opposite to the second active block 134. Also, a second contact 155 is formed to connect the second gate plate 118b. The second contact 155 can be formed above an area between the second active block 134 and the third active block 136. In various embodiments, the first contact 150 includes a bottom portion 152 and a top portion 154. The bottom portion 152 is disposed on and connected to the first gate plate 118a, and the top portion 154 is disposed on and connected to the bottom portion 152. Moreover, the second contact 155 includes a bottom portion 157 and a top portion 159. The bottom portion 157 is disposed on and connected to the second gate plate 118b, and the top portion 159 is disposed on and connected to the bottom portion 157. The first contact 150 and the second contact 155 may be performed using deposition and etching process, and may be made from Al, Cu, W, Ti, Ta, Co, Pt, Ni, refractory material (TiN, TaN, TiW, TiAl), or any combination thereof.

Reference is made to FIGS. 8 and 10. A plurality of top plates (i.e., a first top plate 120a, a second top plate 120b, and a third top plate 120c) are formed on the channel rods 113a~113f. In greater detail, the first top plate 120a is connected to the channel rods 113a, 113c, and 113e, and the second contact 155. Three portions of the first top plate 120a respectively serve as top electrodes 119a, 119c, and 119e (i.e., the drains) of the first transistor PU-1, the third transistor PD-1, and the fifth transistor PG-1. The second top plate 120b is connected to the channel rods 113b, 113d and the first contact 150. Two portions of the second top plate 120b respectively serve as top electrodes 119b and 119d (i.e., the drains) of the second transistor PU-2 and the fourth transistor PD-2. The third top plate 120c is connected to the channel rod 113f. A portion of the third top plate 120c serves as a top electrode 119f (i.e., the drain) of the sixth transistor PG-2. The first top plate 120a, the second top plate 120b, and the third top plate 120c may be performed using epitaxy process, and may be made from Si-based materials.

Furthermore, a gate contact 165 is formed on the third gate plate 165. The gate contact 165 may be performed using deposition and etching process, and may be made from poly-Si with silicide, Al, Cu, W, Ti, Ta, N, refractory material (TiN, TaN, TiW, TiAl), or any combination thereof.

As shown in FIG. 10, a first dielectric layer 170 is formed above the first well 102 and the second well 104, and is disposed around the transistors (the first transistor PU-1 to the sixth transistors PG-2 (see FIG. 8)). For the sake of clarity, the first dielectric layer 170 is depicted in the cross-sectional view and is omitted in the plane view.

Figure 9:
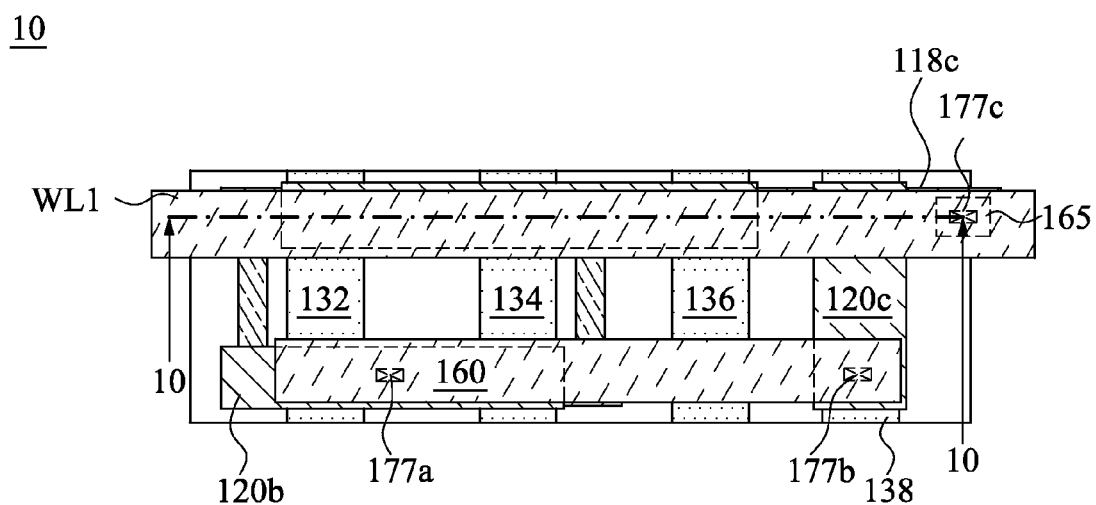
Figure 10:
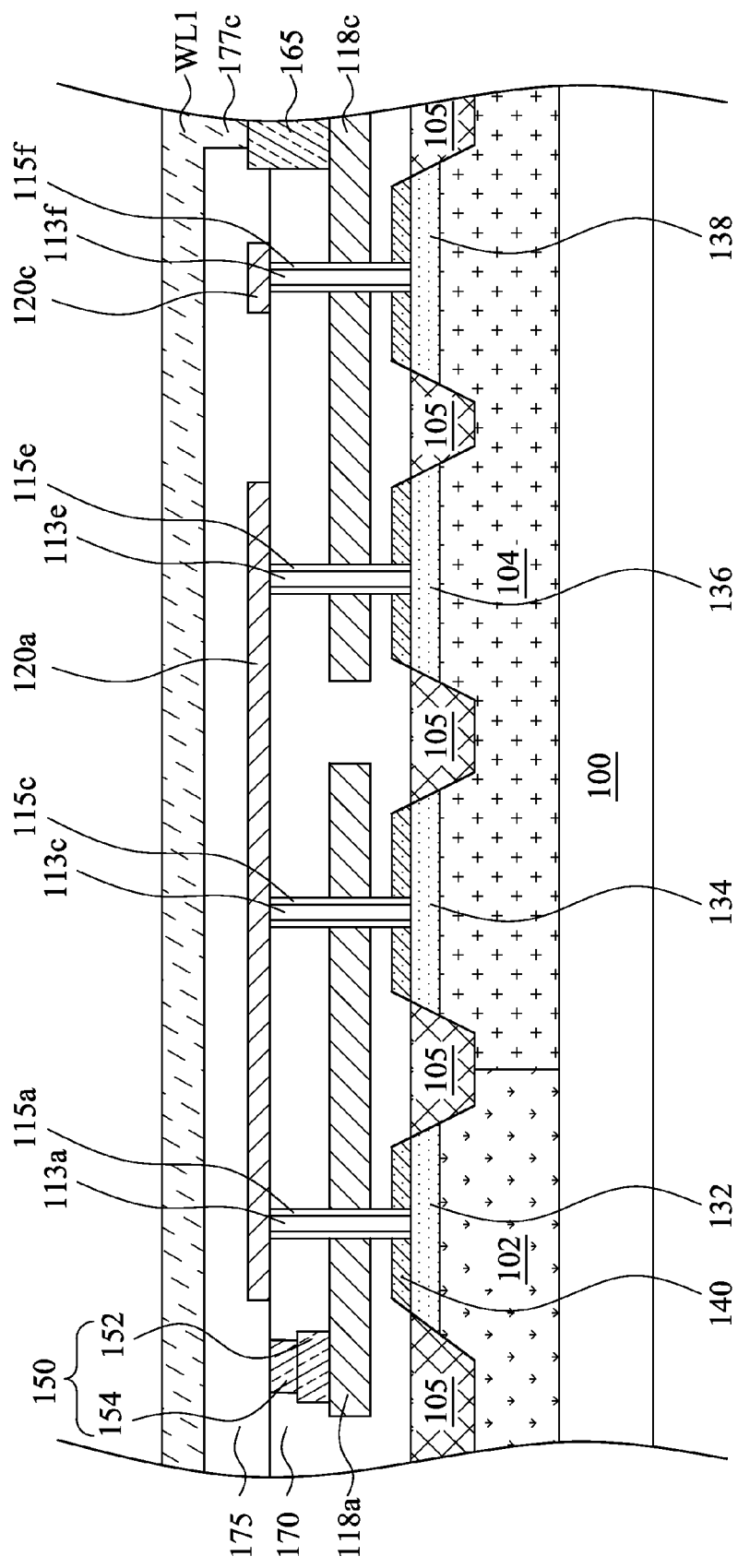
FIG. 10 is a cross-sectional view taken along line 10-10 of FIG. 9.

Reference is made to FIGS. 9 and 10. A second dielectric layer 175 is disposed on the first dielectric layer 170 and covers the elements shown in FIG. 8. A connection structure 160 is formed to connect the second top plate 120b and the third top plate 120c through plugs 177a and 177b, and a first word line WL1 is formed to connect the third gate plate 118c (i.e., connect to the fifth transistor PG-1 and the sixth transistor PG-2 (see FIG. 8)) through a plug 177c. For example, a plurality of openings may be formed in the second dielectric layer 175 to respectively expose portions of the second top plate 120b, the third top plate 120c, and the gate contact 165. Subsequently, a conductive layer can be disposed on the second dielectric layer 175 and fills the openings to form the plugs 117a, 117b, and 117c. The conductive layer is then patterned to be the connection structure 160 and the first word line WL1. The connection structure 160, the first word line WL1, and the plugs 177a, 177b, and 177c may be made from Al, Cu, W, Ti, Ta, Co, Pt, Ni, refractory material (TiN, TaN, TiW, TiAl), or any combination thereof.

Reference is made to FIGS. 8 and 9. From the structural point of view, the first transistor PU-1 includes the bottom electrode 111a (see FIG. 3), the top electrode 119a, the channel rod 113a, the gate insulator 115a (see FIG. 6), and the gate 117a (see FIG. 6). The bottom electrode 111a is formed by a portion of the first active block 132 serving as the source of the first transistor PU-1. The top electrode 119a is formed by a portion of the first top plate 120a serving as the drain of the first transistor PU-1. The gate 117a is formed by a portion of the first gate plate 118a. The channel rod 113a is disposed between the bottom electrode 111a and the top electrode 119a and is connected to the bottom electrode 111a and the top electrode 119a. The gate insulator 115a surrounds the channel rod 113a. The gate 117a surrounds the gate insulator 115a and the channel rod 113a.

The second transistor PU-2 includes the bottom electrode 111b (see FIG. 3), the top electrode 119b, the channel rod 113b, the gate insulator 115b (see FIG. 6), and the gate 117b (see FIG. 6). The bottom electrode 111b is formed by a portion of the first active block 132 serving as the source of the second transistor PU-2. The top electrode 119b is formed by a portion of the second top plate 120b serving as the drain of the second transistor PU-2. The gate 117b is formed by a portion of the second gate plate 118b. The channel rod 113b is disposed between the bottom electrode 111b and the top electrode 119b and is connected to the bottom electrode 111b and the top electrode 119b. The gate insulator 115b surrounds the channel rod 113b. The gate 117b surrounds the gate insulator 115b and the channel rod 113b.

The third transistor PD-1 includes the bottom electrode 111c (see FIG. 3), the top electrode 119c, the channel rod 113c, the gate insulator 115c (see FIG. 6), and the gate 117c (see FIG. 6). The bottom electrode 111c is formed by a portion of the second active block 134 serving as the source of the third transistor PD-1. The top electrode 119c is formed by a portion of the first top plate 120a serving as the drain of the third transistor PD-1. The gate 117c is formed by a portion of the first gate plate 118a. The channel rod 113c is disposed between the bottom electrode 111c and the top electrode 119c and is connected to the bottom electrode 111c and the top electrode 119c. The gate insulator 115c surrounds the channel rod 113c. The gate 117c surrounds the gate insulator 115c and the channel rod 113c.

The fourth transistor PD-2 includes the bottom electrode 111d (see FIG. 3), the top electrode 119d, the channel rod 113d, the gate insulator 115d (see FIG. 6), and the gate 117d (see FIG. 6). The bottom electrode 111d is formed by a portion of the second active block 134 serving as the source of the fourth transistor PD-2. The top electrode 119d is formed by a portion of the second top plate 120b serving as the drain of the fourth transistor PD-2. The gate 117d is formed by a portion of the second gate plate 118b. The channel rod 113d is disposed between the bottom electrode 111d and the top electrode 119d and connected to the bottom electrode 111d and the top electrode 119d. The gate insulator 115d surrounds the channel rod 113d. The gate 117d surrounds the gate insulator 115d and the channel rod 113d.

The fifth transistor PG-1 includes the bottom electrode 111e (see FIG. 3), the top electrode 119e, the channel rod 113e, the gate insulator 115e (see FIG. 6), and the gate 117e (see FIG. 6). The bottom electrode 111e is formed by a portion of the third active block 136 serving as the source of the fifth transistor PG-1. The top electrode 119e is formed by a portion of the first top plate 120a serving as the drain of the fifth transistor PG-1. The gate 117e is formed by a portion of the third gate plate 118c. The channel rod 113e is disposed between the bottom electrode 111e and the top electrode 119e and is connected to the bottom electrode 111e and the top electrode 119e. The gate insulator 115e surrounds the channel rod 113e. The gate 117e surrounds the gate insulator 115e and the channel rod 113e.

The sixth transistor PG-2 includes the bottom electrode 111f (see FIG. 3), the top electrode 119f, the channel rod 113f, the gate insulator 115f (see FIG. 6), and the gate 117f (see FIG. 6). The bottom electrode 111f is formed by a portion of the fourth active block 138 serving as the source of the sixth transistor PG-2. The top electrode 119f is formed by a portion of the third top plate 120c serving as the drain of the sixth transistor PG-2. The gate 117f is formed by a portion of the third gate plate 118c. The channel rod 113f is disposed between the bottom electrode 111f and the top electrode 119f and is connected to the bottom electrode 111f and the top electrode 119f. The gate insulator 115f surrounds the channel rod 113f. The gate 117f surrounds the gate insulator 115f and the channel rod 113f.

In FIG. 8, the first active block 132 serves as a connection structure between the source of the first transistor PU-1 and the source of the second transistor PU-2. The second active block 134 serves as a connection structure between the source of the third transistor PD-1 and the source of the fourth transistor PD-2. The first gate plate 118a serves as a connection structure between the gates 117a and 117c (see FIG. 6). The second gate plate 118b serves as a connection structure between the gates 117b and 117d (see FIG. 6). The third gate plate 118c serves as a connection structure between the gates 117e and 117f (see FIG. 6). The first top plate 120a serves as a connection structure among the drains of the first transistor PU-1, the third transistor PD-1, and the fifth transistor PG-1. The second top plate 120b serves as a connection structure between the drains of the second transistor PU-2 and the fourth transistor PD-2. In this way, other connection structures can be reduced or omitted, resulting in a small layout area and simple manufacturing process of the memory cell 10. In addition, the first contact 150 is connected to the first gate plate 118a and the second top plate 120b, and the second contact 155 is connected to the second gate plate 118b and the first top plate 120a. The connection structure 160 of FIG. 9 is connected to the second top gate 120b and the third top plate 120c.

It is noted that although in FIG. 8, the transistors (PU-1, PU-2, PD-1, PD-2, PG-1, and PG-2) respectively have single channel rod, the claimed scope of the present disclosure is not limited in this respect. In various embodiments, at least one of the transistors includes a plurality of the channel rods.

In FIG. 8, the first gate plate 118a, the second gate plate 118b, and the third gate plate 118c may be parallel to each other. Also, since there is no connection structure between the first gate plate 118a and the second gate plate 118b, the distance therebetween can be reduced. In various embodiments, the memory cell 10 has a length L and a width W satisfying (L/W)>2.5, and the claimed scope of the present disclosure is not limited in this respect.

Figure 11:
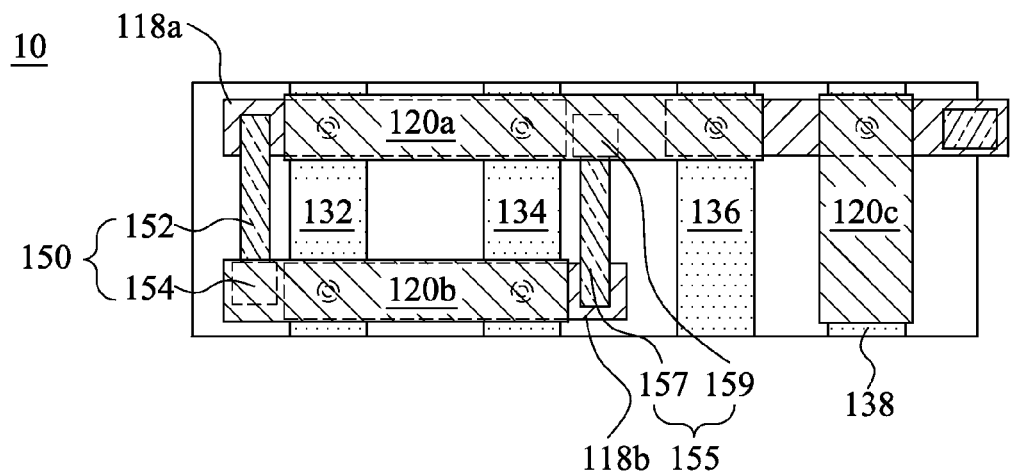
FIG. 11 is a plane view of a memory cell in accordance with various embodiments of the present disclosure.

In FIG. 8, the top portion 154 overlaps the first gate plate 118a and the second top plate 120b, and the bottom portion 152 is disposed between the first gate plate 118a and the top portion 154. Moreover, the top portion 159 overlaps the second gate plate 118b and the first top plate 120a, and the bottom portion 157 is disposed between the second gate plate 118b and the top portion 159. However, the claims scope of the present disclosure is not limited in this respect. FIG. 11 is a plane view of a memory cell 10 in accordance with various embodiments of the present disclosure. In FIG. 11, the bottom portion 152 overlaps the first gate plate 118a and the second top plate 120b, and the top portion 154 is disposed between the second top plate 120b and the bottom portion 152. Moreover, the bottom portion 157 overlaps the second gate plate 118b and the first top plate 120a, and the top portion 159 is disposed between the first top plate 120a and the bottom portion 157. Other relevant structural details of the memory device 10 in FIG. 11 are the same as that in FIG. 8, and, therefore, a description in this regard will not be repeated hereinafter.

Figure 12:
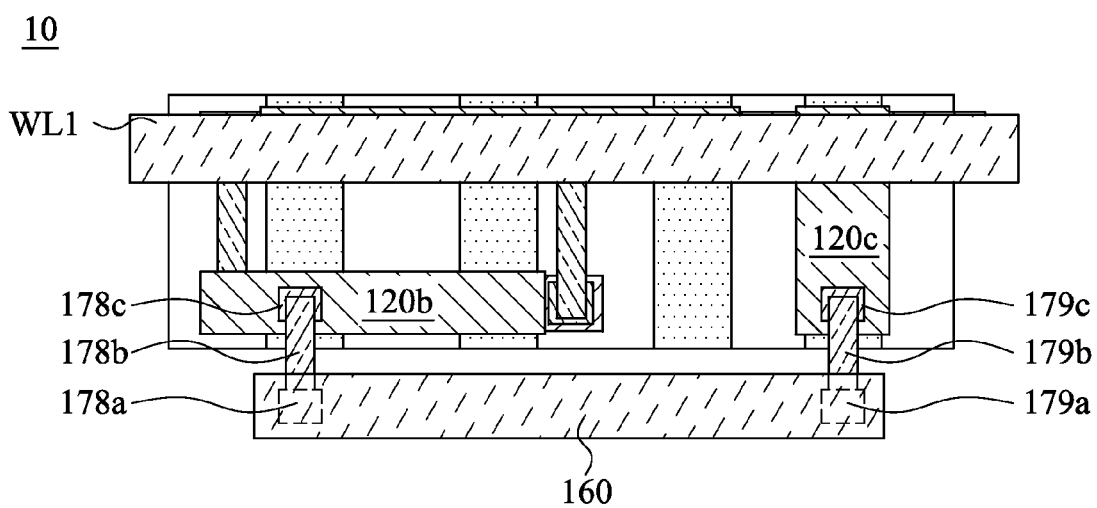
FIG. 12 is a plane view of a memory cell in accordance with various embodiments of the present disclosure.

In FIG. 9, the connection structure 160 is disposed above the second top plate 120b and the third top plate 120c, but the claimed scope of the present disclosure is not limited in this respect. FIG. 12 is a plane view of a memory cell 10 in accordance with various embodiments of the present disclosure. In FIG. 12, the connection structure 160 is connected to the second top plate 120b through contacts 178a, 178b, and 178c in sequence, and is connected to the third top plate 120c through contacts 179a, 179b, and 179c in sequence. Other relevant structural details of the memory device 10 in FIG. 12 are the same as that in FIG. 9, and, therefore, a description in this regard will not be repeated hereinafter.

Figure 13A:
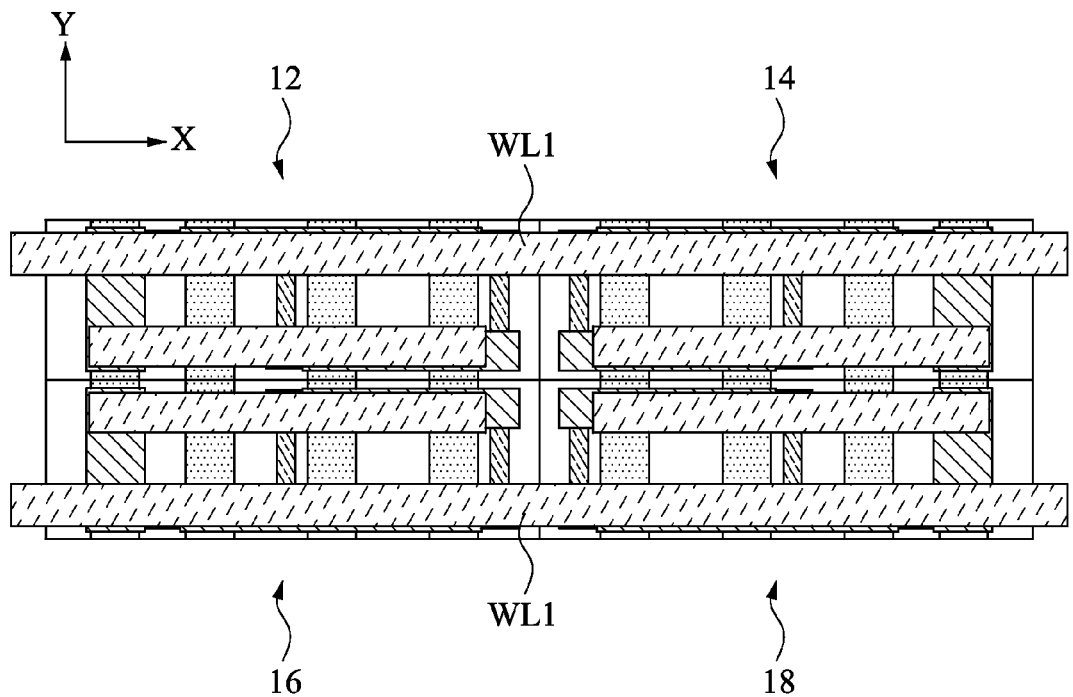
FIGS. 13A and 13B are plane view of memory devices including the memory cell of FIG. 9 in accordance with various embodiments of the present disclosure.
Figure 13B:
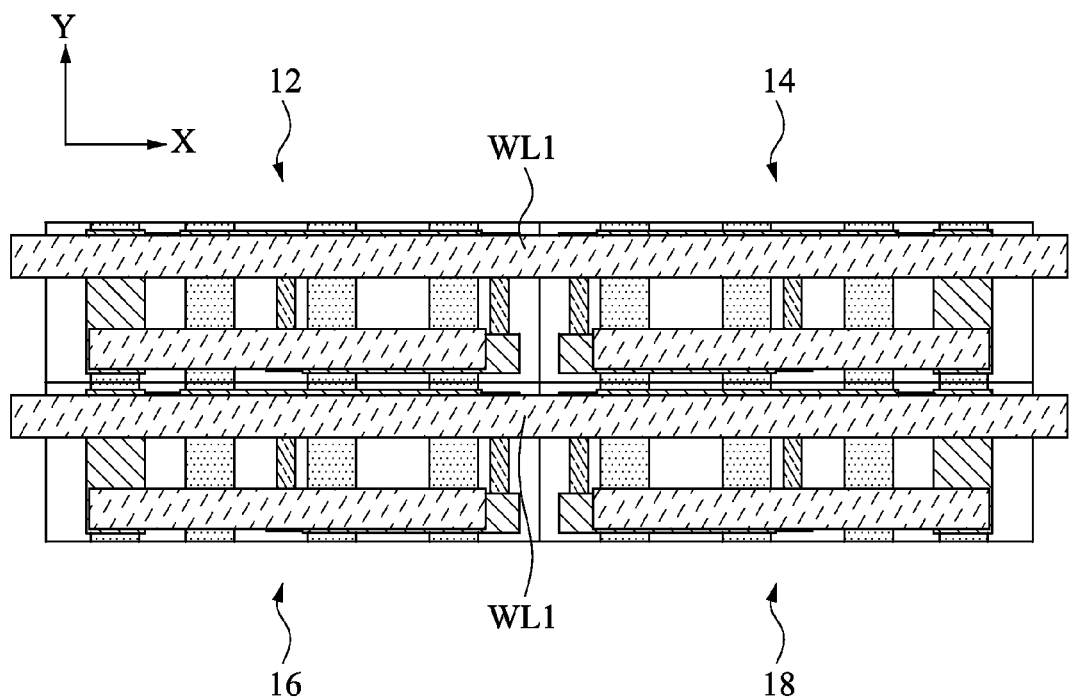

FIGS. 13A and 13B are plane view of memory devices including the memory cell of FIG. 9 in accordance with various embodiments of the present disclosure. The memory device includes memory cells 12, 14, 16, and 18. In FIG. 13A, the memory cells 12, 14, 16, and 18 have an identical structure as the memory cell 10 of FIG. 9 but different orientations. In greater detail, the memory cells 12 and 14 are symmetric with relative to the illustrated Y axis, and the memory cells 16 and 18 are symmetric with relative to the illustrated Y axis. The memory cells 12 and 16 are symmetric with relative to the illustrated X axis, and the memory cells 14 and 18 are symmetric with relative to the illustrated X axis. In FIG. 13B, the memory cells 12, 14, 16, and 18 have an identical structure as the memory cell 10 of FIG. 9, but the orientation of the memory cells 12 and 16 is different from that of the memory cells 14 and 18. In greater detail, the memory cells 12 and 14 are symmetric with relative to the illustrated Y axis, and the memory cells 16 and 18 are symmetric with relative to the illustrated Y axis. In FIGS. 13A and 13B, the memory cells 12, 14, 16, and 18 as a group may be reproduced and allocated as a plurality of rows and columns to form a memory cell array. Both of the first word lines WL1 of FIGS. 13A and 13B in adjacent two of the memory cells (such as the memory cells 12 and 14) can be integrally formed. However, the claimed scope of the present disclosure is not limited in this respect.

Figure 14:
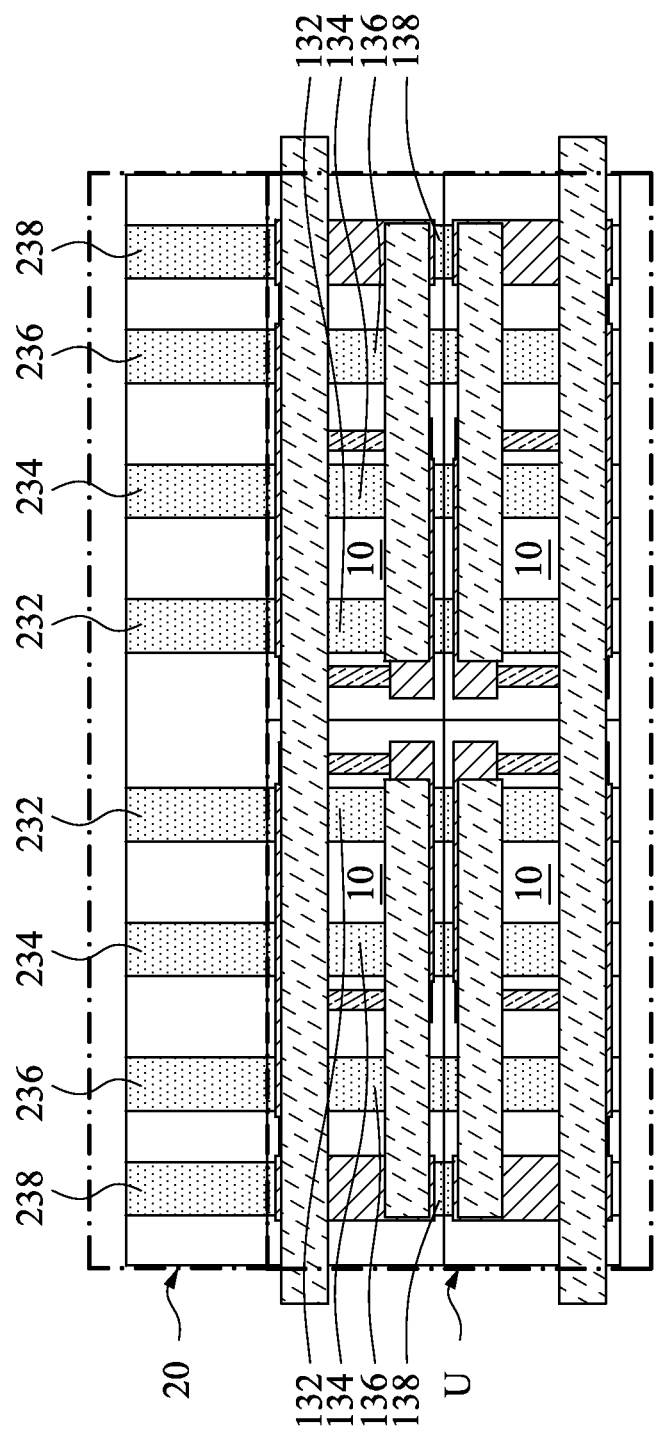
FIG. 14 is a plane view of a memory device including the memory cell of FIG. 9 in accordance with various embodiments of the present disclosure.

In various embodiments, the active blocks (i.e., the first active block 132, the second active block 134, the third active block 136, and the fourth active block 138) of FIG. 9 can be electrically connected to external signals such as bit line signals and power supply signals to reduce the resistances of the active blocks. The following paragraphs provide detailed explanations with respect to how to connect the memory cell 10 with the external signals. FIG. 14 is a plane view of a memory device including the memory cell 10 of FIG. 9 in accordance with various embodiments of the present disclosure. In FIG. 14, the memory device includes a plurality of the memory cells 10. The memory cells 10 form an array unit U. The memory device further includes a strap cell 20 connected to the array unit U. The strap cell 20 includes a plurality of active straps 232~238 respectively connected to the active blocks (i.e., the first active block 132, the second active block 134, the third active block 136, and the fourth active block 138) disposed in the memory cell 10 adjacent to the strap cell 20. In greater detail, the active straps 232 is connected to the first active straps 132, the active straps 234 is connected to the second active straps 134, the active straps 236 is connected to the third active straps 136, and the active straps 238 is connected to the fourth active straps 138. Even though the array unit U in FIG. 14 includes 2*2 array of the memory cell 10, the array unit U may include or greater than 8*4 array of the memory cells 10 in various embodiments, and the claimed scope of the present disclosure is not limited in this respect.

Figure 15A:
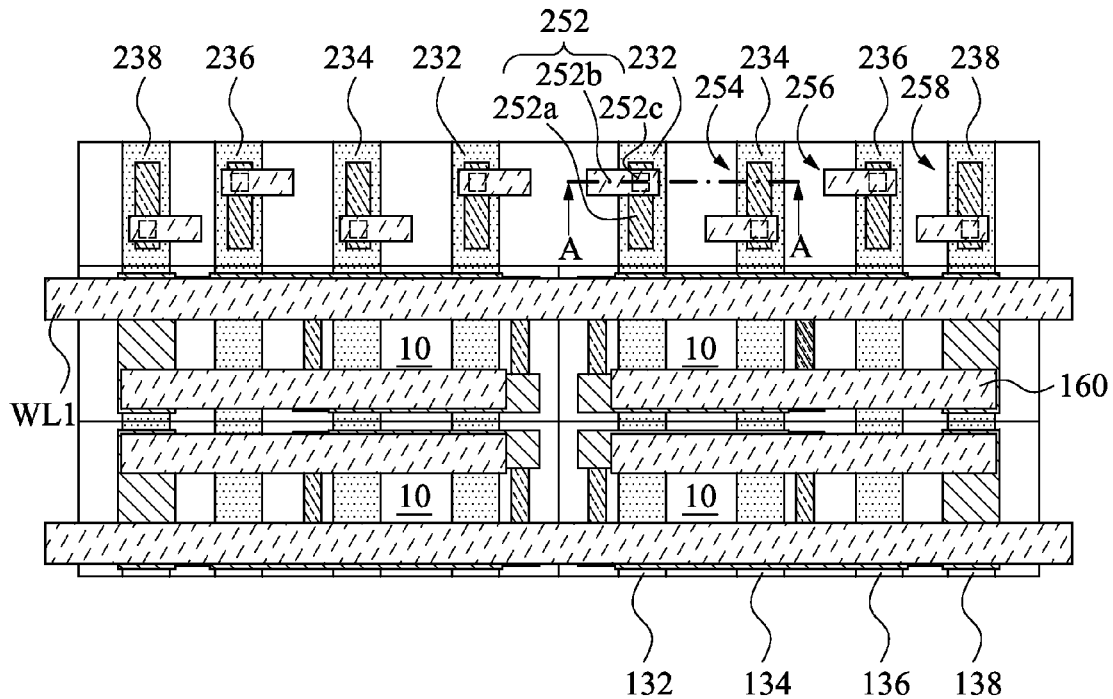
FIGS. 15A and 16A are plane views of a method for manufacturing a memory device in accordance with various embodiments of the present disclosure.
Figure 15B:
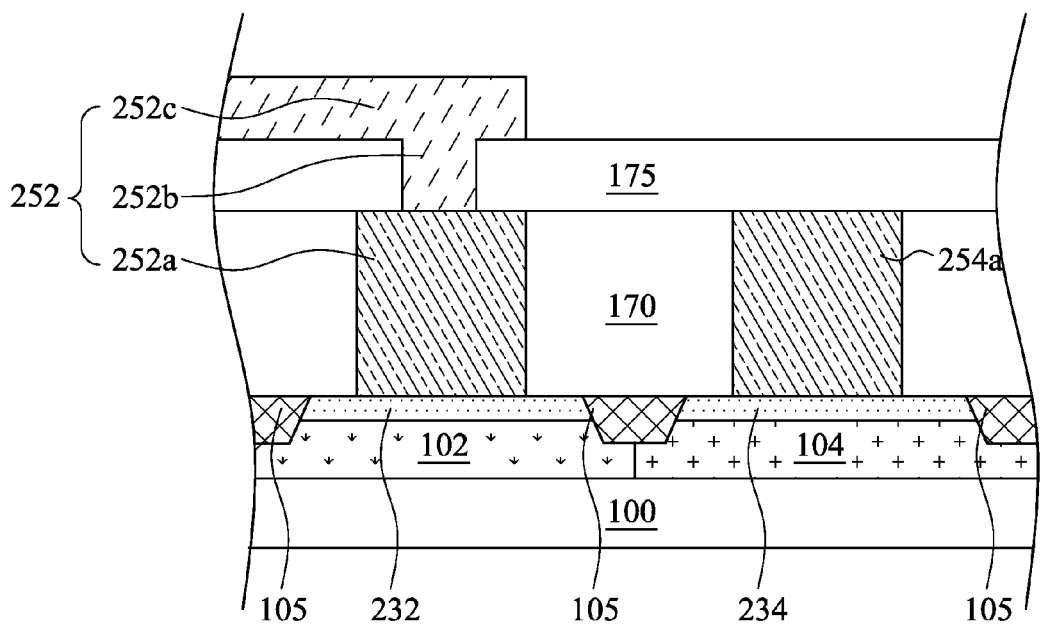
FIGS. 15B and 16B are cross-sectional views respectively taken along line A-A of FIGS. 15A and 16A.
Figure 16A:
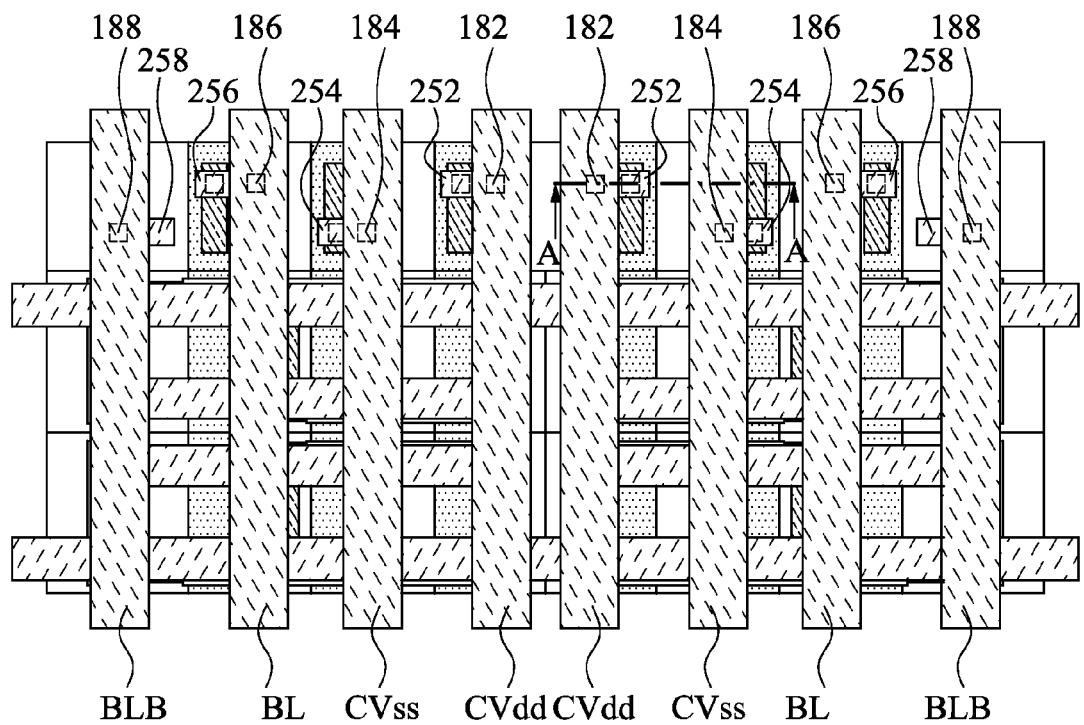
Figure 16B:
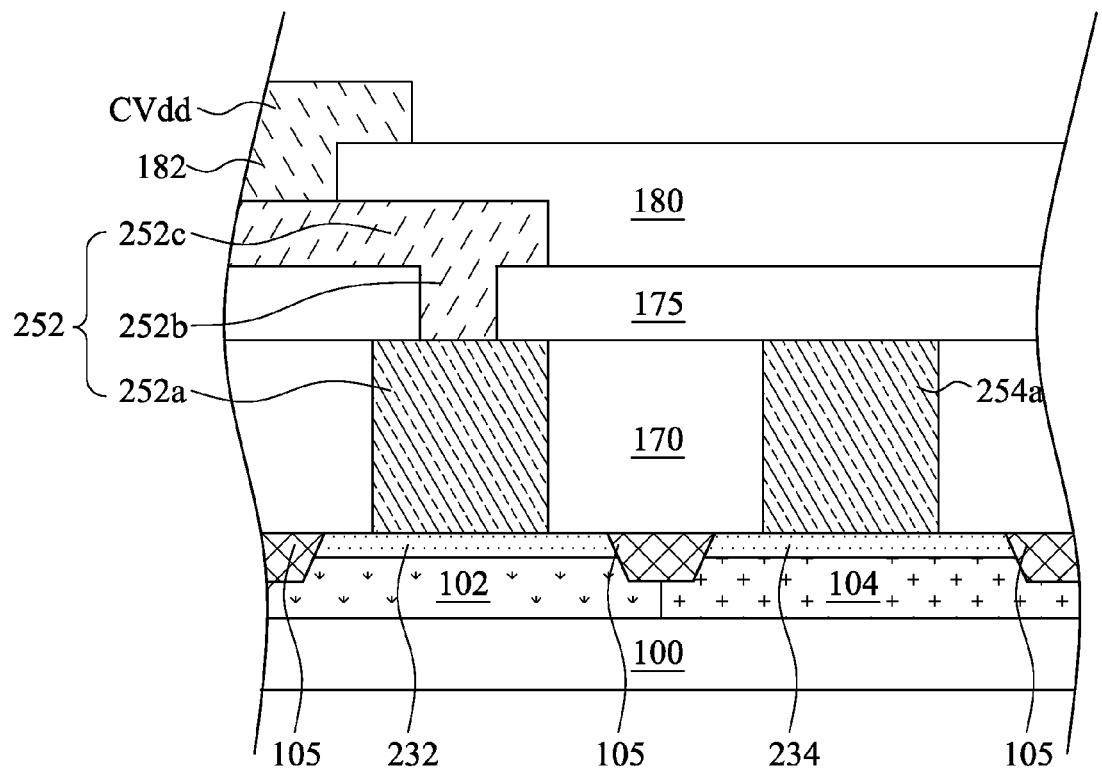

FIGS. 15A and 16A are plane views of a method for manufacturing a memory device in accordance with various embodiments of the present disclosure, and FIGS. 15B and 16B are cross-sectional views respectively taken along line A-A of FIGS. 15A and 16A. Reference is made to FIGS. 15A and 15B. A plurality of contact groups 252~258 are formed to respectively connect the active straps 232~238. Taking the contact group 252 as an example, the contact group 252 includes contacts 252a, 252b and plugs 252c. The contact 252a, the plug 252c, and the contact 252b are sequentially disposed on and connected to the active strap 232. The contact 252a is disposed in the first dielectric layer 170, the plug 252c is disposed in the second dielectric layer 175, and the contact 252b is disposed on the second dielectric layer 175. Since the relevant structural details of the contact group 254, 256, and 258 are the same as that of the contact group 252, and, therefore, a description in this regard will not be repeated hereinafter. The contact groups 252~258 may be made from Al, Cu, W, Ti, Ta, Co, Pt, Ni, refractory material (TiN, TaN, TiW, TiAl), or any combination thereof. In various embodiments, the contact groups 252~258, the first word lines WL1, and the connection structures 160 of FIG. 9 can be formed in the same process. However, the claimed scope of the present disclosure is not limited in this respect.

Reference is made to FIGS. 16A and 16B. A third dielectric layer 180 is formed on the second dielectric layer 175 and covers the elements shown in FIG. 15A. For the sake of clarity, the third dielectric layer 180 is depicted in the cross-sectional view and is omitted in the plane view. Subsequently, a plurality of conductors (i.e., power supply conductors CVdd, CVss, first bit lines BL, and second bit lines BLB) are formed on the second dielectric layer 180 and electrically connected to the contacts 252~258 respectively through plugs 182, 184, 186, and 188. In greater detail, the power supply conductors CVdd are electrically connected to the contacts 252 through the plug 182, the power supply conductors CVss are electrically connected to the contacts 254 through the plug 184, the first bit lines BL are electrically connected to the contacts 256 through the plug 186, and the second bit lines BLB are electrically connected to the contacts 258 through the plug 188. For example, a plurality of openings can be formed in the third dielectric layer 180 to respectively expose portions of the contacts 252~258, and another conductive layer is formed on the second dielectric layer 180 and fills in the openings to form the plugs 182, 184, 186, and 188. Then the conductive layer is patterned to be the power supply conductors CVdd, CVss, the first bit lines BL, and the second bit lines BLB. The power supply conductors CVdd, CVss, the first bit lines BL, and the second bit lines BLB may be made from Al, Cu, W, Ti, Ta, Co, Pt, Ni, refractory material (TiN, TaN, TiW, TiAl), or any combination thereof.

Reference is made to FIGS. 15A and 16A. From the structural point of view, the contact 252 connects the power supply conductors CVdd and the active straps 232. Therefore, the first active block 132 is electrically connected to the power supply conductors CVdd. The contact 254 connects the power supply conductors CVss and the active straps 234. Therefore, the second active block 134 is electrically connected to the power supply conductors CVss. The contact 256 connects the first bit line BL and the active straps 236. Therefore, the third active block 136 is electrically connected to the first bit line BL. The contact 258 connects the second bit line BLB and the active straps 238. Therefore, the fourth active block 138 is electrically connected to the second bit line BLB.

As mentioned in FIG. 8, in various embodiments, (L/W) >2.5. Therefore, the routing of the first bit line BL and second bit line BLB is substantially parallel to the short side (a side having the width W) of the memory cell 10 for low bit-line RC delay performance and memory cell speed improvement.

Figure 17A:
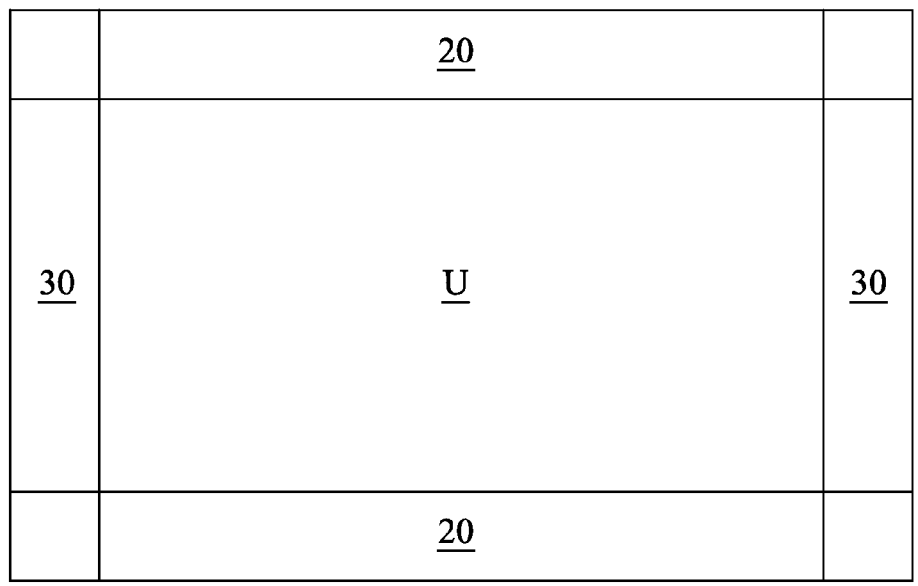
FIG. 17A is a plane view of a memory device in accordance with various embodiments of the present disclosure.

FIG. 17A is a plane view of a memory device 10 in accordance with various embodiments of the present disclosure. For the sake of clarity, the elements of the array unit U and of the strap cells 20 are omitted in FIG. 17A. In FIG. 17A, the memory device includes two of the strap cells 20 respectively disposed at opposite sides of the array unit U. The conductors (i.e., the power supply conductors CVdd, CVss, the first bit lines BL, and the second bit lines BLB (see FIG. 16A)) are connected to the active straps 252~258 (see FIG. 16A) of the two strap cells 20 to reduce the whole resistance between the conductors and the active straps 252~258. In various embodiments, the memory device further includes a plurality of edge cells 30 respectively disposed at other opposite sides of the array unit U.

Figure 17B:
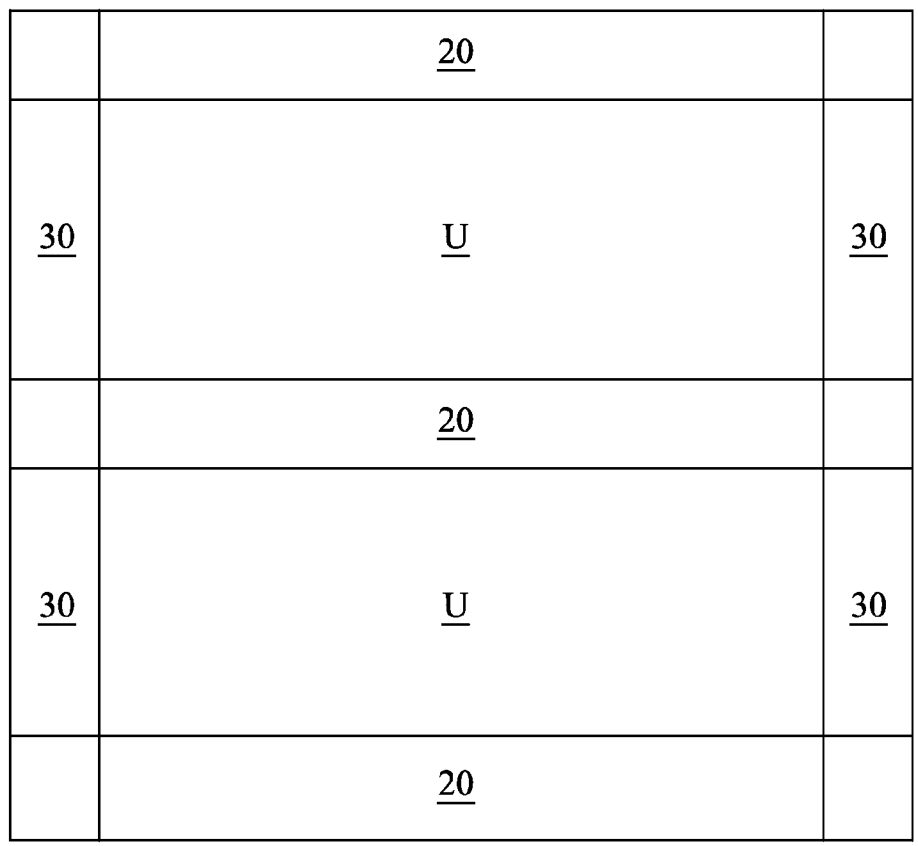
FIG. 17B is a plane view of a memory device in accordance with various embodiments of the present disclosure.

FIG. 17B is a plane view of a memory device 10 in accordance with various embodiments of the present disclosure. For the sake of clarity, the elements of the array unit U and of the strap cells 20 are omitted in FIG. 17B. The difference between FIGS. 17B and 17A pertains to numbers of the array units U, the strap cells 20, and the edge cells 30. In FIG. 17B, the memory device includes two of the array units U, three of the strap cells 20, and four of the edge cells 30. The strap cells 20 and the array units U are alternatingly arranged. The edge cells 30 are respectively disposed at opposite sides of the two array units U. In various embodiments, the memory device can include a plurality of the array cells 10 and the strap cells 20 alternatingly arranged.

Figure 18A:
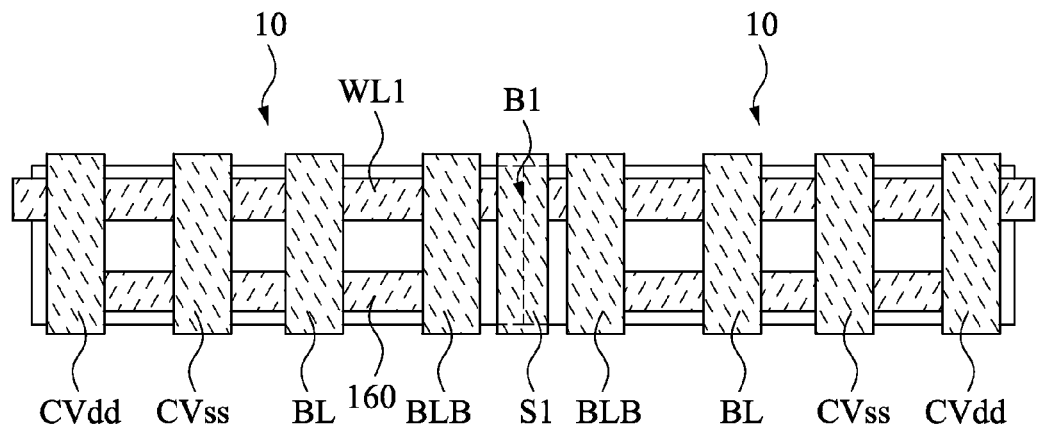
FIGS. 18A-18C are plane views of memory cells in accordance with various embodiments of the present disclosure.
Figure 18B:
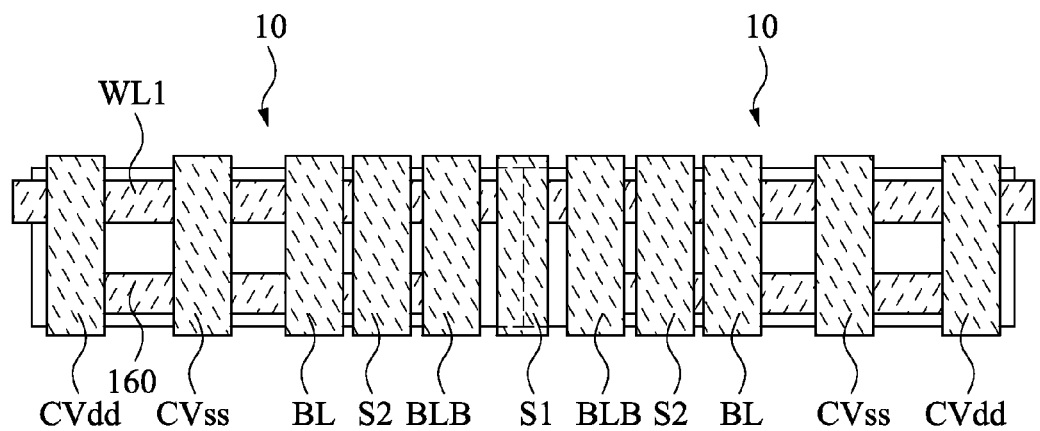
Figure 18C:
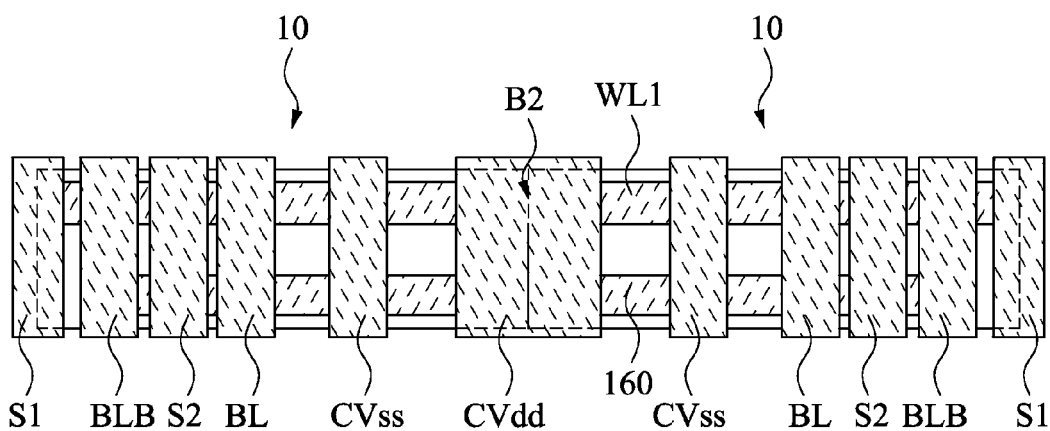

FIGS. 18A-18C are plane views of memory cells 10 in accordance with various embodiments of the present disclosure. For the sake of clarity, the elements below the first word line WL1 and the connection structure 160 are omitted in FIGS. 18A-18C. In FIG. 18A, the memory cell 10 further includes a shielding metal S1 disposed between two of the second bit lines BLB respectively in adjacent two of the memory cells 10 and at the boundary B1 of the memory cells 10. Two of the second bit lines BLB of adjacent two memory cells 10 are shielded from one another by the shielding metal S1. The shielding metal S1 can be electrically connected to CVss or CVdd. Compared with FIG. 18A, the memory cell 10 of FIG. 18B further includes a shielding metal S2 disposed between the first bit line BL and the second bit line BLB. The first bit line BL and the second bit line BLB are shielded from one another by the shielding metal S2. The shielding metal S2 can be electrically connected to CVss. Compared with FIG. 18B, the power supply conductor CVdd of FIG. 18C extends across the boundary B2 of the memory cell 10. The power supply conductor CVdd can be electrically connected to the active blocks 132 (see FIG. 15A) of adjacent two of the memory cells 10. That is, the power supply conductors CVdd in adjacent two of the memory cells 10 can be combined to be a single power supply conductors CVdd. Other relevant structural details of the memory device in FIGS. 18A-18C are the same as that in FIG. 16A, and, therefore, a description in this regard will not be repeated hereinafter.

Figure 19A:
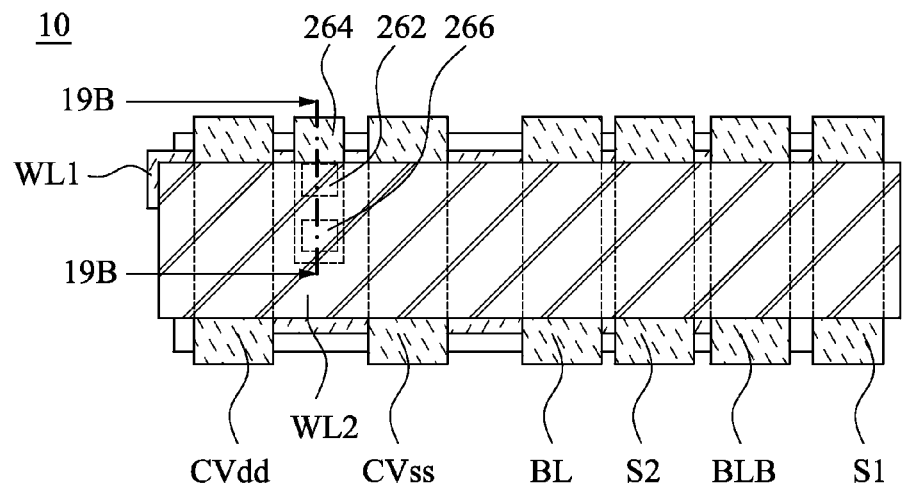
FIG. 19A is a plane view of a memory cell in accordance with various embodiments of the present disclosure.
Figure 19B:
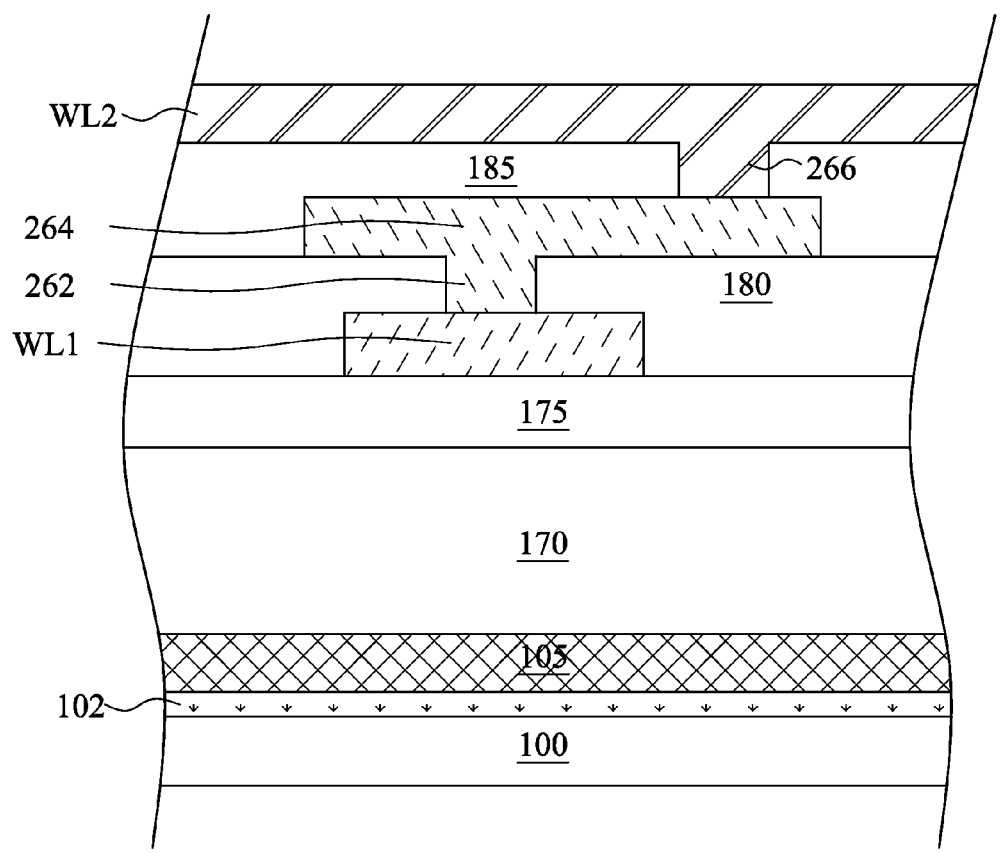
FIG. 19B is a cross-sectional view taken along line 19B-19B of FIG. 19A.

FIG. 19A is a plane view of a memory cell 10 in accordance with various embodiments of the present disclosure, and FIG. 19B is a cross-sectional view taken along line 19B-19B of FIG. 19A. For the sake of clarity, the elements below the first word line WL1 and the connection structure 160 are omitted in FIG. 19A. In FIGS. 19A and 19B, the memory cell 10 further includes a second word line WL2 disposed above the first word line WL1 and connected to the first word line WL1 through a plug 266, a contact 264, and a plug 262 in sequence. For example, the plug 262 and the contact 264 are sequentially formed in and on the third dielectric layer 180 to connect the first word line WL1. Subsequently, a fourth dielectric layer 185 can be formed on the third dielectric layer 180 and covers the contact 264, the first bit line BL, the second bit line BLB, the power supply conductors CVdd, CVss, and the shielding metals S1, S2. An opening is then formed in the fourth dielectric layer 185 to expose a portion of the contact 264, and another conductive layer is formed on the fourth dielectric layer 185 and fills the opening to form the plug 266. The conductive layer then is patterned to form the second word line WL2. Through the combination between the second word line WL2 and the first word line WL1, the whole word line resistance can be reduced. The second word line WL2, the plug 266, the contact 264, and the plug 262 may be made from Al, Cu, W, Ti, Ta, Co, Pt, Ni, refractory material (TiN, TaN, TiW, TiAl), or any combination thereof. Other relevant structural details of the memory device in FIGS. 19A and 19B are the same as that in FIG. 18B, and, therefore, a description in this regard will not be repeated hereinafter.

Figure 20:
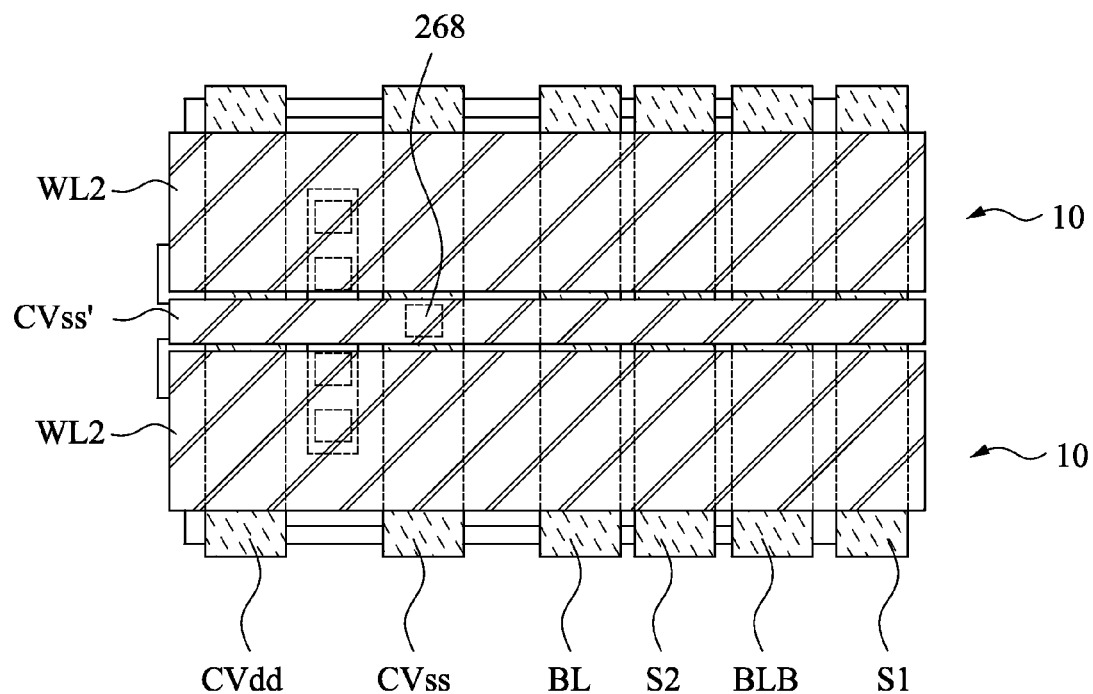
FIG. 20 is a plane view of a memory device in accordance with various embodiments of the present disclosure.

FIG. 20 is a plane view of a memory device in accordance with various embodiments of the present disclosure. The difference between FIGS. 20 and 19A pertains to the presence of a power mesh conductor CVss'. In FIG. 20, the memory device further includes the power mesh conductor CVss' disposed between two of the second word lines WL2 and electrically connected to the power supply conductors CVss through a plug 268. The power mesh conductor CVss' is employed to further improve the function and speed of the memory device. Other relevant structural details of the memory device in FIG. 20 are the same as that in FIG. 19A, and, therefore, a description in this regard will not be repeated hereinafter.

Figure 21A:
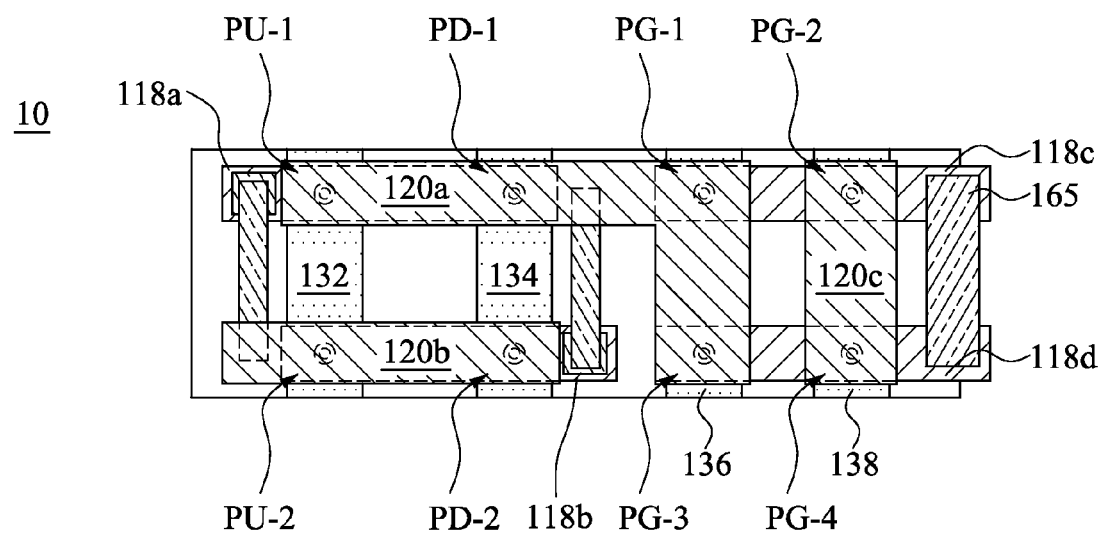
FIG. 21A is a plane view of a memory cell in accordance with various embodiments.
Figure 21B:
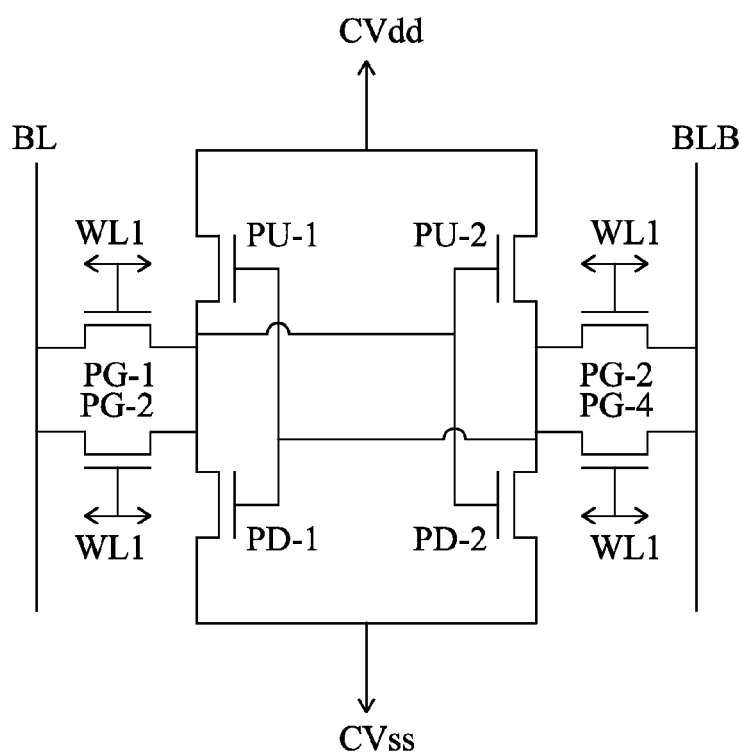
FIG. 21B is a circuit diagram of the memory cell of FIG. 21A.

FIG. 21A is a plane view of a memory cell in accordance with various embodiments, and FIG. 21B is a circuit diagram of the memory cell 10 of FIG. 21A. For the sake of clarity, the first word line WL1, the first bit line BL, the second bit line BLB, and the power supply conductors CVdd, CVss are depicted in the circuit diagram and not in the plane view. The difference between FIGS. 21A, 21B and FIGS. 2A, 2B pertains to the presence of a seventh transistor PG-3 and an eighth transistor PG-4. In FIGS. 21A and 21B, the memory cell 10 further includes the seventh transistor PG-3 and the eighth transistor PG-4. The fifth transistor PG-1 and the seventh transistor PG-3 are connected in parallel, and the sixth transistor PG-2 and the eighth transistor PG-4 are connected in parallel for speed improvement. Another portion of the third active block 136 serves as a source of the seventh transistor PG-3, and still another portion of the first top plate 120a serves as a drain of the seventh transistor PG-3. Another portion of the fourth active block 138 serves as a source of the eighth transistor PG-4, and another portion of the third top plate 120c serves as a drain of the eighth transistor PG-4. A gate of the seventh transistor PG-3 and a gate of the eighth transistor PG-4 form a fourth gate plate 118d. The contact 165 is connected to the third gate plate 118c and the fourth gate plate 118d. Since the seventh transistor PG-3 and the eighth transistor PG-4 are disposed in the remaining area of the memory cell 10, the layout area of the memory cell 10 is still the same as including the seventh transistor PG-3 and the eighth transistor PG-4. Other relevant structural details of the memory cell in FIGS. 21A and 21B are the same as that in FIGS. 2A and 2B, and, therefore, a description in this regard will not be repeated hereinafter.

Figure 22:
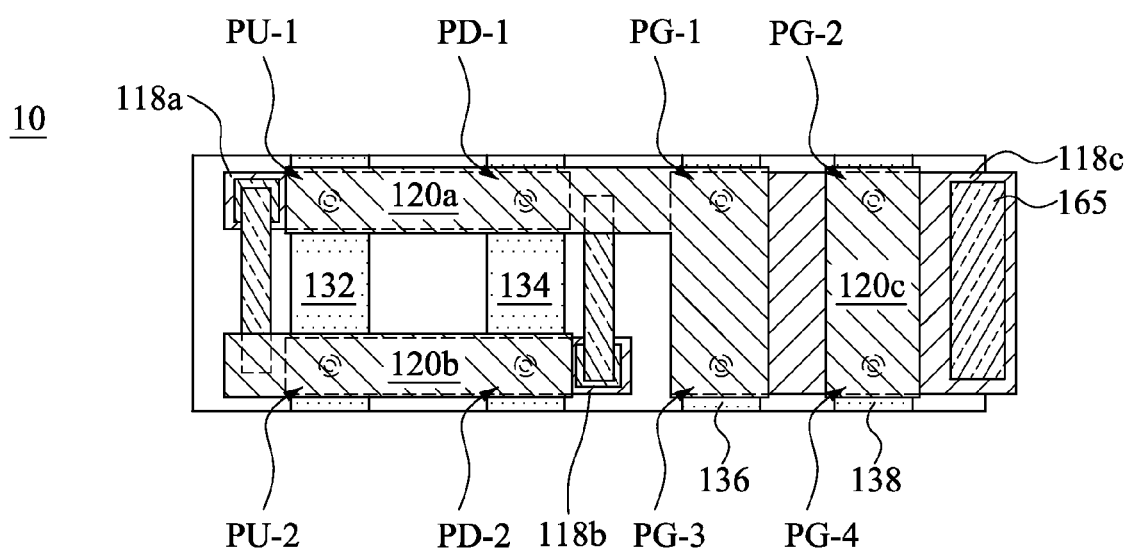
FIG. 22 is a plane view of a memory cell in accordance with various embodiments.

FIG. 22 is a plane view of a memory cell 10 in accordance with various embodiments. The difference between FIGS. 22 and 21A pertains to the gate configuration. In this embodiment, the third gate plate 118c of FIG. 21A and the fourth plate 118d of FIG. 21A are integrally formed. That is, the gates of the fifth transistor PG-1 to the eighth transistor PG-4 are respectively formed by portions of the third gate plate 118c. Other relevant structural details of the memory cell in FIG. 22 are the same as that in FIG. 21A, and, therefore, a description in this regard will not be repeated hereinafter.

Figure 23A:
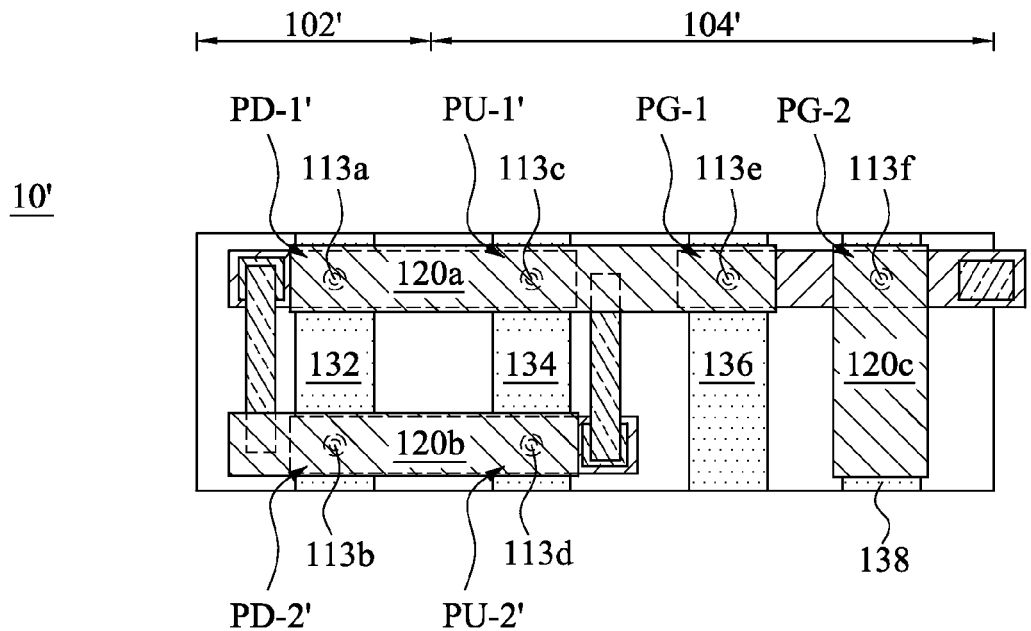
FIG. 23A is a plane view of a memory cell in accordance with various embodiments.
Figure 23B:
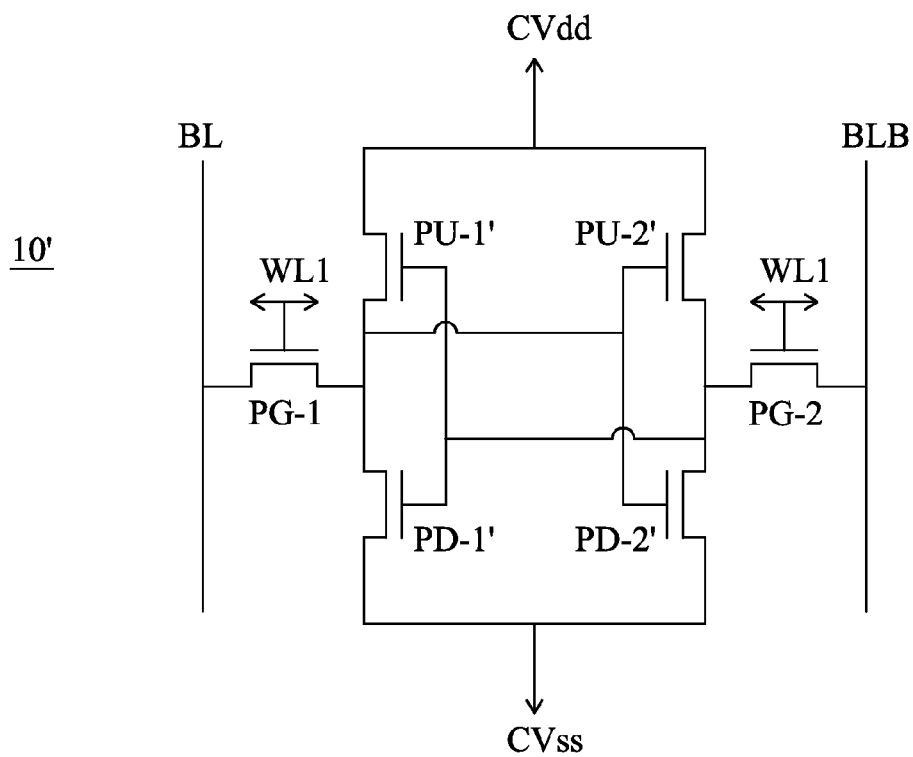
FIG. 23B is a circuit diagram of the memory cell of FIG. 23A.

FIG. 23A is a plane view of a memory cell in accordance with various embodiments, and FIG. 23B is a circuit diagram of the memory cell 10' of FIG. 23A. For the sake of clarity, the word line WL, the first bit lines BL, the second bit line BLB, and the power supply conductors CVdd, CVss are depicted in the circuit diagram and not in the plane view. The difference between FIGS. 23A, 23B and FIGS. 2A, 2B pertains to the type of the memory cell. In FIGS. 23A and 23B, the memory cell 10' is a P-type pass gate device. That is, the first well 102' is a P-type well, and the second well 104' is an N-type well. The first transistor PD-1' and the second transistor PD-2' are pull-down transistors, the third transistor PU-1' and the fourth transistor PU-2' are pull-up transistors, and the fifth transistor PG-1 and the sixth transistor PG-2 are pass-gate transistors. The power supply conductor CVss is electrically connected to the first transistor PD-1' and the second transistor PD-2', the power supply conductor CVdd is electrically connected to the third transistor PU-1' and the fourth transistor PU-2', the first bit line BL is electrically connected to the fifth transistor PG-1, and the second bit line BLB is electrically connected to the sixth transistor PG-2. The channel rods 113a and 113b may be performed an n-doping process, and the channel rods 113c, 113d, 113e, and 113f may be performed a p-doping process. The first active block 132 may be made from SiP, SiC, Si, Ge, III-V materials, or any combination thereof. The second active block 134, the third active block 136, and the fourth active block 138 may be made from SiGe, Ge, SiP, SiC, III-V materials, or any combination thereof. The III-V materials include InP, InAs, GaAs, AlInAs, InGaP, InGaAs, GaAsSb, GaPN, AlPN, or any combination thereof. Other relevant structural details of the memory cell in FIGS. 23A and 23B are the same as that in FIGS. 2A and 2B, and, therefore, a description in this regard will not be repeated hereinafter.

In various embodiment of the present disclosure, the transistors of the memory cells are vertical-gate-all-around (VGAA) transistors, which provide high integration densities. The gate of the VGAA transistors surrounds its channel region on sides, thereby improving its ability to control the flow of current and exhibiting good short channel control. In addition, portions of the active blocks respectively serve as the sources or drains of the transistors, and since the active blocks in one of the memory cell extend across opposite boundaries, the active blocks in adjacent two of the memory cells can be connected together. Therefore, not only the active blocks can serve as connection structures among the transistors in one memory cell, but also external signals can be supplied to multiple memory cells simultaneously through the active blocks that are connected to each other.

In various embodiments, a memory device includes a plurality of memory cells At least one of the memory cells includes a plurality of transistors with vertical-gate-all-around configurations and a plurality of active blocks. A portion of at least one of the active blocks serves as a source or a drain of one of the transistors.

In various embodiments, a memory device includes a plurality of memory cells At least one of the memory cells includes a plurality of active blocks and a plurality of transistors. At least one of the transistors includes a bottom electrode, a top electrode, a channel rod, a gate insulator, and a gate. The bottom electrode is formed by a portion of one of the active blocks serving as one of a source and a drain of the transistor. The top electrode serves as the other of the source and the drain. The channel rod is disposed between the bottom electrode and the top electrode and is connected to the bottom electrode and the top electrode. The gate insulator surrounds the channel rod. The gate surrounds the channel rod and the gate insulator.

In various embodiments, a method for manufacturing a memory device includes forming an array of memory cells on or above a substrate. Forming at least one of the memory cells includes forming a plurality of active blocks on or above the substrate. A plurality of transistors with vertical-gate-all-around configurations are formed above the substrate. A Portion of one the active blocks serves as a source or a drain of one of the transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a plurality of memory cells forming an array unit, at least one of the memory cells comprising:
   a plurality of transistors with vertical-gate-all-around configurations; and
   a plurality of active blocks, a portion of at least one of the active blocks serving as a source or a drain of one of the transistors, wherein one of the active blocks of said at least one of the memory cells comprises dopants different from dopants of another of the active blocks of said at least one of the memory cells;
a strap cell connected to the array unit, wherein the strap cell comprises a plurality of active straps respectively connected to the active blocks of the memory cell adjacent to the strap cell;
at least one bottom conductor;
at least one bottom contact disposed on at least one of the active straps and electrically connecting the at least one of the active straps and the at least one bottom conductor;
at least one top conductor, wherein the top conductor and the at least one of the active straps extend along different directions; and
at least one top contact disposed on the bottom conductor and electrically connecting the bottom conductor and the top conductor.

2. The memory device of claim 1, wherein the active blocks extend across opposite boundaries of the memory cell.

3. The memory device of claim 1, wherein the active blocks of one of the memory cells are respectively connected to the active blocks of the adjacent memory cell.

4. The memory device of claim 1, further comprising:
a shielding metal disposed between adjacent two of a plurality of bottom conductors that include the bottom conductor, and the top conductor overlaps the shielding metal.

5. The memory device of claim 4, wherein the shielding metal extends along the direction of the at least one of the active straps.

6. The memory device of claim 1, wherein at least one of the memory cells further comprises:
a first well; and
a second well disposed adjacent to the first well, the first well and the second well together occupying a layout area of the memory cell, dopants of the first well being different from dopants of the second well.

7. The memory device of claim 1, wherein at least one of the memory cells is a six-transistor (6T) static random access memory (SRAM).

8. The memory device of claim 1, wherein the at least one bottom conductor extends along the direction of the at least one of the active straps.

9. A memory device comprising:
a plurality of memory cells forming an array unit, at least one of the memory cells comprising:
a plurality of active blocks, wherein one of the active blocks of said at least one of the memory cells comprises dopants different from dopants of another of the active blocks of said at least one of the memory cells; and
a plurality of transistors, at least one of the transistors comprising:
a bottom electrode formed by a portion of one of the active blocks serving as one of a source and a drain of the transistor;
a top electrode serving as the other of the source and the drain;
a channel rod disposed between the bottom electrode and the top electrode and connected to the bottom electrode and the top electrode;
a gate insulator surrounding the channel rod; and
a gate surrounding the channel rod and the gate insulator;
a strap cell connected to the array unit, wherein the strap cell comprises a plurality of active straps respectively connected to the active blocks of the memory cell adjacent to the strap cell;
at least one bottom conductor;
at least one bottom contact disposed on at least one of the active straps and electrically connecting the at least one of the active straps and the bottom conductor;
at least one top conductor, wherein the top conductor and the at least one of the active straps extend along a different directions; and
at least one top contact disposed on the bottom conductor and electrically connecting the bottom conductor and the top conductor.

10. The memory device of claim 9, wherein the active blocks comprise:
a first active block;
a second active block;
a third active block; and
a fourth active block,
wherein the transistors of at least one of the memory cells comprise:
a first transistor;
a second transistor, the bottom electrode of the first transistor and the bottom electrode of the second transistor forming the first active block;
a third transistor, the gate of the first transistor and the gate of the third transistor forming a first gate plate;
a fourth transistor, the gate of the second transistor and the gate of the fourth transistor forming a second gate plate, and the bottom electrode of the third transistor and the bottom electrode of the fourth transistor forming the second active block;
a fifth transistor, the bottom electrode of the fifth transistor being formed by a portion of the third active block; and
a sixth transistor, the bottom electrode of the sixth transistor being formed by a portion of the fourth active block, and the gate of the fifth transistor and the gate of the sixth transistor forming a third gate plate.

11. The memory device of claim 10, wherein the first active block and the second active block are respectively electrically connected to power supply conductors of a plurality of bottom conductors including the at least one bottom conductor, the third active block is electrically connected to a first bit-line of the plurality of bottom conductors including the at least one bottom conductor, and the fourth active block is electrically connected to a second bit-line of the plurality of bottom conductors including the at least one bottom conductor.

12. The memory device of claim 10, wherein the top electrode of the first transistor, the top electrode of the third transistor, and the top electrode of the fifth transistor form a first top plate; the top electrode of the second transistor and the top electrode of the fourth transistor form a second top plate.

13. The memory device of claim 12, wherein at least one of the memory cells further comprises:
a first contact electrically connected to the first gate plate and the second top plate; and
a second contact electrically connected to the second gate plate and the first top plate.

14. The memory device of claim 13, wherein at least one of the memory cells further comprises:
a seventh transistor, the bottom electrode of the fifth transistor and the bottom electrode of the seventh transistor forming the third active block; and an eighth transistor electrically connected to the sixth transistor, the bottom electrode of the sixth transistor and the bottom electrode of the eighth transistor forming the fourth active block, and the gate of the seventh transistor is electrically connected to the gate of the eighth transistor and the third gate plate.

15. The memory device of claim 13, wherein at least one of the memory cells further comprises:
   a third top plate, a portion of the third top plate serving as the top electrode of the sixth transistor; and
   a connection structure electrically connected to the second top plate and the third top plate.

16. The memory device of claim 10, wherein at least one of the memory cells further comprises:
   a first word line electrically connected to the third gate plate.

17. The memory device of claim 16, further comprising:
   a second word line disposed above the first word line and connected to the first word line.

18. A method for manufacturing a memory device, the method comprising:
   forming a plurality of memory cells in an array unit on or above a substrate, wherein forming at least one of the memory cells comprises:
      forming a plurality of active blocks on or above the substrate, wherein one of the active blocks of said at least one of the memory cells comprises dopants different from dopants of another of the active blocks of said at least one of the memory cells; and
      forming a plurality of transistors with vertical-gate-all-around configurations above the substrate, wherein a portion of one the active blocks serves as a source or a drain of one of the transistors;
   forming a strap cell connected to the array unit, wherein the strap cell comprises a plurality of active straps respectively connected to the active blocks of the memory cell adjacent to the strap cell;
   forming at least one bottom contact on at least one of the active straps;
   forming at least one bottom conductor on the bottom contact such that the bottom conductor is electrically connected to said at least one of the active straps where the bottom contact is formed through the bottom contact;
   forming at least one top contact on the bottom conductor; and
   forming at least one top conductor on the top contact such that the top conductor is electrically connected to said at least one of the active straps where the top contact is formed through the top contact, and the top conductor and the at least one of the active straps extend along different directions.

19. The method of claim 18, wherein forming at least one of the transistors comprises:
   forming a channel rod on or above one of the active blocks;
   forming a gate insulator to surround the channel rod;
   forming a gate to surround the channel rod and the gat insulator; and
   forming a top electrode on or above the channel rod.

20. The method of claim 18, further comprising:
   respectively electrically connecting a first active block of the active blocks and a second active block of the active blocks to power supply conductors of a plurality of bottom conductors including the at least one bottom conductor;
   electrically connecting a third active block of the active blocks to a first bit-line of the plurality of bottom conductors including the at least one bottom conductor; and
   electrically connecting a fourth active block of the active blocks to a second bit-line of the plurality of bottom conductors including the at least one bottom conductor.

* * * * *